(12) United States Patent
Menard

(10) Patent No.: US 7,927,976 B2
(45) Date of Patent: Apr. 19, 2011

(54) REINFORCED COMPOSITE STAMP FOR DRY TRANSFER PRINTING OF SEMICONDUCTOR ELEMENTS

(75) Inventor: Etienne Menard, Durham, NC (US)

(73) Assignee: Semprius, Inc., Durham, NC (US)

( * ) Notice: Subject to any disclaimer, the term of this patent is extended or adjusted under 35 U.S.C. 154(b) by 483 days.

(21) Appl. No.: 12/177,963

(22) Filed: Jul. 23, 2008

(65) Prior Publication Data
US 2010/0018420 A1 Jan. 28, 2010

(51) Int. Cl.
H01L 21/00 (2006.01)
B41L 47/04 (2006.01)
B29C 33/40 (2006.01)
B29C 39/22 (2006.01)
B29C 65/70 (2006.01)

(52) U.S. Cl. ............... 438/478; 425/436 R; 425/110; 257/E21.233; 257/E21.279; 257/E21.54; 257/E29.296; 156/581; 156/584; 264/220; 264/239; 101/368

(58) Field of Classification Search ............ 101/368; 264/220, 239; 425/436 R, 110; 156/581, 156/584; 438/478
See application file for complete search history.

(56) References Cited

U.S. PATENT DOCUMENTS

| | | | |
|---|---|---|---|
| 3,453,714 | A | 7/1969 | Clark et al. |
| 4,503,335 | A | 3/1985 | Takahashi |
| 5,151,386 | A | 9/1992 | Bottani et al. |
| 5,512,131 | A | 4/1996 | Kumar et al. |
| 5,669,303 | A | 9/1997 | Maracas et al. |
| 5,789,117 | A | 8/1998 | Chen |
| 5,817,242 | A | 10/1998 | Biebuyck et al. |
| 5,937,758 | A | 8/1999 | Maracas et al. |
| 5,947,027 | A | 9/1999 | Burgin et al. |
| 6,062,133 | A | 5/2000 | Blalock |
| 6,333,561 | B1 | 12/2001 | Chen |
| 6,521,489 | B2 | 2/2003 | Duthaler et al. |
| 7,117,790 | B2 | 11/2003 | Kendale et al. |
| 6,675,465 | B2 | 1/2004 | Ulrich |
| 6,740,543 | B2 | 5/2004 | Rutiser |
| 6,792,856 | B2 | 9/2004 | Hall et al. |

(Continued)

FOREIGN PATENT DOCUMENTS
TW 200710562 3/2007
(Continued)

OTHER PUBLICATIONS

International Search Report and Written Opinion, Corresponding to International Application No. PCT/US2009/065078, Mailed Apr. 23, 2010.

(Continued)

*Primary Examiner* — Evan Pert
(74) *Attorney, Agent, or Firm* — Greenlee Sullivan P.C.

(57) ABSTRACT

Provided are reinforced composite stamps, devices and methods of making the reinforced composite stamps disclosed herein. Reinforced composite stamps of certain aspects of the present invention have a composition and architecture optimized for use in printing systems for dry transfer printing of semiconductor structures, and impart excellent control over relative spatial placement accuracy of the semiconductor structures being transferred. In some embodiments, for example, reinforced composite stamps of the present invention allow for precise and repeatable vertical motion of the patterned surface of the printing apparatus with self-leveling of the stamp to the surface of a contacted substrate. Reinforced composite stamps of certain aspect of the present invention achieve a uniform distribution of contact forces between the printing apparatus patterned surface and the top surface of a substrate being contacted by the reinforced composite stamp of the printing apparatus.

69 Claims, 8 Drawing Sheets

U.S. PATENT DOCUMENTS

| | | |
|---|---|---|
| 6,829,988 B2 | 12/2004 | George et al. |
| 6,855,378 B1 | 2/2005 | Narang |
| 6,876,081 B2 | 4/2005 | Chow |
| 6,881,366 B2 | 4/2005 | Hougham et al. |
| 6,918,982 B2 | 7/2005 | Afzali-Ardakani et al. |
| 7,195,733 B2 | 10/2005 | Rogers et al. |
| 6,976,424 B2 | 12/2005 | Bruno et al. |
| 7,207,430 B2 | 4/2007 | Davis et al. |
| 7,235,464 B2 | 6/2007 | Bona et al. |
| 7,295,256 B2 | 11/2007 | Kim |
| 7,296,519 B2 | 11/2007 | Dona et al. |
| 7,363,854 B2 | 4/2008 | Sewell |
| 7,429,552 B2 | 9/2008 | Afzali-Ardakani et al. |
| 7,434,512 B2 | 10/2008 | Bietsch et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,704,684 B2 | 4/2010 | Rogers et al. |
| 2002/0140298 A1 | 10/2002 | Maruyama |
| 2003/0047535 A1 | 3/2003 | Schueller et al. |
| 2003/0213382 A1 | 11/2003 | Kendale et al. |
| 2005/0062066 A1 | 3/2005 | Bao et al. |
| 2005/0103270 A1 | 5/2005 | Yoshida et al. |
| 2005/0173049 A1 | 8/2005 | Dona et al. |
| 2006/0196377 A1 | 9/2006 | Loopstra et al. |
| 2006/0234499 A1 | 10/2006 | Kodera et al. |
| 2006/0286488 A1 | 12/2006 | Rogers et al. |
| 2006/0286785 A1 | 12/2006 | Rogers et al. |
| 2007/0032089 A1 | 2/2007 | Nuzzo et al. |
| 2008/0000373 A1 | 1/2008 | Petrucci-Samija et al. |
| 2008/0055581 A1 | 3/2008 | Rogers et al. |
| 2008/0108171 A1 | 5/2008 | Rogers et al. |
| 2008/0157235 A1 | 7/2008 | Rogers et al. |
| 2009/0199960 A1 | 8/2009 | Nuzzo et al. |
| 2010/0002402 A1 | 1/2010 | Rogers et al. |
| 2010/0052112 A1 | 3/2010 | Rogers et al. |
| 2010/0123268 A1 | 5/2010 | Menard |

FOREIGN PATENT DOCUMENTS

| | | |
|---|---|---|
| TW | 200738553 | 10/2007 |
| TW | 2008/48812 | 12/2008 |
| TW | 200904640 | 2/2009 |
| WO | WO 97/06012 | 2/1997 |
| WO | WO 2005/104756 | 11/2005 |
| WO | WO 2005/122285 | 12/2005 |
| WO | WO 2006/130721 | 12/2006 |
| WO | WO 2007/126412 | 11/2007 |
| WO | WO 2008/030960 | 3/2008 |
| WO | WO 2008/036837 | 3/2008 |
| WO | WO 2008/047144 | 4/2008 |
| WO | WO 2008/055054 | 5/2008 |
| WO | WO 2008/143635 | 11/2008 |
| WO | WO 2009/011709 | 1/2009 |
| WO | WO 2009/111641 | 9/2009 |
| WO | WO 2010/011713 | 1/2010 |
| WO | WO 2010/036807 | 4/2010 |
| WO | WO 2010/059781 | 5/2010 |

OTHER PUBLICATIONS

Parker, J.L. (Aug. 1, 2006) "An Analytical Characterization of PCB Delamination and Comparison of Adhesion Tests," *Printed Circuit Design FAB* http://www.pcdandf.com/cms/magazine/172/2802-an-analytical-characterization-of-pcb-delamination-and-comparison-of-adhesion-tests.

Sun et al. (2004) "Fabricating Semiconductor Nano/Microwires and Transfer Printing Ordered Arrays of Them onto Plastic Substrates," *Nano Lett.* 4(10):1953-1959.

PCT Chapter II Demand for Corresponding PCT Application, PCT/us2009/051350, Mailed Apr. 9, 2010.

International Search Report and Written Opinion, Corresponding to International Application No. PCT/US2010/039414, Mailed Sep. 1, 2010.

U.S. Appl. No. 11/145,574, filed Jun. 2, 2005, Nuzzo et al.

Benkendorfer et al. (Jun. 2007) "Printing Unities III-Vs and Silicon," *Compounds Semiconductor* 3 pages.

International Search Report and Written Opinion, Corresponding to International Application No. PCT/US09/51350, Mailed Sep. 24, 2009.

Michel et al. (Sep. 2001) "Printing Meets Lithography: Soft Approaches to High-Resolution Patterning," *IBM J. Res. Dev.* 45(5):697-708.

Placement accuracy color plot (μm rms)

REINFORCED COMPOSITE STAMP FOR DRY TRANSFER PRINTING OF SEMICONDUCTOR ELEMENTS

STATEMENT REGARDING FEDERALLY SPONSORED RESEARCH OR DEVELOPMENT

This invention was made, at least in part, with United States governmental support awarded by National Science Foundation Grant IIP-0712017. The United States Government has certain rights in this invention.

CROSS-REFERENCE TO RELATED APPLICATIONS

Not Applicable

BACKGROUND OF THE INVENTION

The disclosure herein relates to the general field of systems, devices and methods for micro-and nanofabrication, including pattern transfer devices for soft lithography, contact printing, and dry transfer printing. More specifically, provided are reinforced composite stamps for printing-based assembly of semiconductor elements for the fabrication of electronic devices and systems, which provide high transfer yields and good transfer fidelity of printable semiconductor elements. In addition, processes for making and using reinforced composite stamps are disclosed.

Distributed electronic systems often require large quantities of micro-scale and/or nano-scale semiconductor structures and/or devices sparsely patterned and assembled over large area substrates. As an example, low profile heliostat concentration solar photovoltaic systems require prolific use of sparsely distributed micro-scale solar cells.

Fabrication of such distributed electronic systems predominantly relies on a two step process wherein high performance electronic circuits and solar cells are first fabricated on wafer substrates having relatively small areas. Traditionally, after completion of the circuit and/or solar cell fabrication, the semiconductor wafers are cingulated and each miniature semiconductor element or device is individually pick and placed to sparsely populate a large-area device substrate. Using conventional processing approaches, such processes become prohibitively costly and resource intensive as the number of semiconductor elements increases and their size approaches sub-millimeter dimensions.

One alternative approach for populating such distributed electronic systems is transfer printing batches of micro-scale and/or nano-scale semiconductor structures and/or devices onto device substrates using a massively parallel stamping approach. Processes related to developing a stamp-based dry transfer printing platform capable of accessing high yields, accuracy, consistency, reliability and excellent quality presents a number of challenges. These challenges arise, at least in part, from the small and hard-to-manage dimensions of the semiconductor structures and devices, as well as the properties of the stamp itself that inherently is made from fragile and miniature elements subject to flexion and other spurious properties that can hinder the ability to achieve accurate, consistent and reliable printing-based assembly.

Although composite stamps are known in the art of micro- and nanofabrication, conventional stamps for these applications suffer limitations when used for dry transfer printing of micro-scale semiconductor structures and/or devices that impede commercial development of printing-based assembly of distributed electronic systems. These limitations include, for example, short stamp life, inability to perform high-yield dry transfer printing of micro-scale semiconductor structures, unmanageable thermal contractions and mechanical deformations, lack of adaptability to nonplanar surfaces, lack of accuracy and reproducibility, uneven distribution of contact forces between the stamp printing apparatus and the top surface of a substrate being patterned, problems in efficiently attaching the stamp to a semiconductor transfer printing tool, and difficulties in transfer printing of micro-scale semiconductors on substrates having areas larger than that of the stamp.

A variety of conventional composite stamps and printing systems suffer from one or more of the above problems and limitations. Furthermore, many of those stamps and systems are designed for soft lithography on substrates which are never larger than the stamp and, therefore are not well suited for dry transfer printing to substrates having a surface area larger than the composite stamp surface area.

U.S. Pat. No. 5,512,131, issued on Apr. 30, 1996, (Kumar and Whitesides) discloses patterning systems and methods for plating self-assembled mono layers, plating and etching a surface, attaching biomolecules and forming a template from an existing pattern so as to reproduce that pattern.

U.S. Pat. No. 5,817,242 issued on Oct. 6, 1998 (Biebuyck and Michel) discloses patterning using a stamp having posts that are defined in a hard material (such as poly(methylenmethacrylate) or poly-Si) in combination with a deformable layer and a backing layer that functions as a rigid support for the stamp. Incorporation of a hard material for posts in stamps of this reference may result in limitations in the adaptability or conformability to uneven surfaces and even distribution of contact forces, thereby hindering high-fidelity patterning via dry transfer contact printing.

U.S. Pat. No. 7,117,790, issued Oct. 10, 2006, (Kendale et al.) discloses a stamp configuration incorporating a rigid glass backing that imparts a degree of reinforcement to the stamp. The glass backing of this reference, however, has a thickness that is greater than about 6 mm. Such a thick and rigid glass backplane is likely to require large pressure forces in the range of 35 to 60 kPa (5 to 8.7 PSI) to establish effective conformal contact with some substrates. Such large pressures can limit the effective lifetime of the stamp and damage fragile semiconductor structures upon transfer and assembly on substrate surfaces. The large pressures apparently required in the systems and methods of Kendale et al. may also deform the receiving substrate, limit uniformity of the printing and limit adaptability or conformability to uneven substrate surfaces. In addition, the stamp disclosed in Kendale et al. requires stiff coupling between the stamp and its actuating and sensing elements. Furthermore, to achieve co-planarity between the rigid stamp and a substrate (e.g., silicon), three coil actuators and stainless flexures are used. Due to the overall rigidity of the stamp in Kendale, it is not clear that this stamp configuration can attain a uniform pressure across the stamping area, especially in view of the excessive rigidity of the thick stamp glass backing layer. The limitations of the Kendale et al. stamps and processes are evident in the high level of printing defects shown in this reference, likely indicating that the printing pressure is non-uniform across the stamp. That stamp uses a high pressure chamber to cause the stamp backing to deflect, creating a minimum point. Such stamp backing deflection may hinder high placement accuracy due to radial distortions, especially in the case of micro-scale and/or nanoscale semiconductors elements. In addition, patterning using the system in Kendale et al. is limited to receiving substrates having an area similar in size to that of the stamp element.

U.S. Pat. No. 7,195,733, issued Mar. 27, 2007, (Rogers and Menard) discloses multilayer composite stamps for making patterns of microscale and/or nanoscale features on substrate surfaces. The composite stamps of this reference comprise a plurality of polymer layers, wherein the Young's Modulus of each layer is selected to provide patterning exhibiting good resolution and high fidelity.

As will be generally recognized from the foregoing, a need currently exists for printing-based patterning devices and processes for micro- and nanofabrication applications. Specifically, stamps capable of high performance are needed to enable a cost effective, high resolution printing-based fabrication platform for the assembly of distributed electronic devices and systems.

SUMMARY OF THE INVENTION

Provided are reinforced composite stamps, devices and methods of making the reinforced composite stamps disclosed herein. Reinforced composite stamps of certain aspects of the present invention have a composition and architecture optimized for use in printing systems for dry transfer contact printing of semiconductor structures, and impart excellent control over relative spatial placement accuracy of the semiconductor structures being transferred. In some embodiments, for example, reinforced composite stamps of the present invention allow for precise and repeatable vertical motion of the patterned surface of the printing apparatus with self-leveling of the stamp to the surface of a contacted substrate. Reinforced composite stamps of certain aspects of the present invention achieve a uniform distribution of contact forces between the printing apparatus patterned surface and the top surface of a substrate being contacted by the reinforced composite stamp of the printing apparatus.

Also provided are methods of patterning, assembling and integrating semiconductor elements using reinforced composite stamps of the present invention and printing devices and systems incorporating the reinforced composite stamps disclosed herein. The present invention includes process strategies for integrating a thin glass, flexible and high modulus backing into a reinforced composite stamp for printing apparatuses. In some embodiments, for example, methods of making reinforced composite stamps of the present invention impart a degree of flexibility to the sides of the glass backing of the reinforced composite stamp to enable application of an overall uniform vertical pressure by the stamp during dry transfer printing and, thus maintain a planar surface by avoiding deformation of the glass backing under pressure. Also provided are processes for attaching reinforced stamps of the present invention to a semiconductor dry transfer printing tool for printing applications. Also provided are processing methods using the present reinforced composite stamps wherein "step-and-repeat" printing is used to pattern large area substrates with semiconductor structures, including semiconductor devices.

In some aspects, reinforced composite stamps of the present invention integrate a thin glass rigid backing layer (e.g., thickness<500 microns), a reinforcement layer having an opening that vertically coincides with at least a portion of the printable surface region of the stamp (e.g., the relief features of the deformable layer). Such an opening configuration of the reinforcement layer provides a composite stamp having mechanical properties useful accessing performance benefits over conventional stamps for soft lithographic patterning. Reinforced composite stamps of the invention, for example, enable a fabrication platform for high-fidelity and high-yield dry transfer printing and assembly of semiconductor structures. The present composite stamps and processing methods are suitable for a range of fabrication applications for distributed electronic systems, and are particularly attractive for applications involving sparse patterning of large-area substrates with semiconductor-based electronic devices and/or device components.

In an aspect, the geometry of the reinforced composite stamp facilitates a convenient, reliable and mechanically robust attachment with related devices and processing systems, such as a print tool head or other stamp actuator or component thereof that provides clearance when a donor or a target substrate is brought into contact with the composite stamp. Composite stamps of the present invention are capable of achieving high-accuracy and reliable printing by constraining unwanted in-plane motion along the receiving and/or printing surface of the stamp while preserving vertical flexibility. Minimal in plane motion is beneficial for achieving high-accuracy and high yield transfer printing. Vertical flexibility is important for achieving conformal contact, especially with uneven surfaces, which impacts the ability to pick-up structures (e.g., "inking" the stamp) and also to subsequently deposit the structures onto or into a target substrate. In general, conventional stamps suffer from not sufficiently addressing the need for the combination of in plane rigidity and vertical flexibility.

In plane motion is minimized by use of a rigid support layer and reinforcement layer such that unwanted in-plane motion is avoided without unduly impacting overall vertical flexibility of the stamp. In some embodiments, shaping the reinforcement layer into a particular geometry or layout allows the distribution of a mechanical parameter of the stamp to be effectively controlled and/or preselected for a desired patterning application. Reinforcement layers of certain embodiments, for example, have a flexural rigidity lower than that of the rigid support layer and a central orifice shape corresponding to the shape and/or size of the printable region of the stamp. This combination of components provides useful in plane rigidity without unduly impacting vertical flexibility in the stamp printing region and enhances the overall mechanical stability and lifetime of the stamp.

In an aspect, a composite stamp of the present invention integrates a thin rigid support layer with a reinforcement layer having an opening that vertically coincides with at least a portion of the relief features used to facilitate printing. This combination of device components enables composite stamps having vertical flexibility useful for enhancing conformal contact with the stamp and a substrate undergoing processing while maintaining a degree of in-plane rigidity useful for achieving high resolution and high yield transfer. In an embodiment, for example, the invention provides a composite stamp extending laterally along lateral dimensions and vertically along a vertical dimension comprising: (i) a deformable layer having an internal surface and an external surface positioned opposite the internal surface, the external surface of the deformable layer having a plurality of relief features; (ii) a rigid support layer connected to the internal surface of the deformable layer, wherein the rigid support layer has a bottom surface and a top surface positioned opposite the bottom surface, wherein the bottom surface is positioned proximate to the internal surface of the deformable layer; and (iii) a reinforcement layer operably connected to the rigid support layer, the reinforcement layer having an opening that vertically coincides with at least a portion of the relief features of the external surface of the deformable layer. In an embodiment of this aspect, the deformable layer, rigid layer and reinforcement layer are configured to provide the stamp having an anisotropic distribution Young's modulus or flexural rigidity providing flexibility along the vertical dimension and in-plane rigidity along the lateral dimensions of the composite stamp. As used herein, "connected" broadly refers to either direct bonding between layers or indirect bonding between layers via one or more intermediate layers or structures, such as an adhesive layer. Connected structures and layers may be bonded, for example, by chemical bonding involving covalent bonds, dipole-dipole interactions, hydrogen bonding, Van der Waals forces, London forces or any combination of these. As used herein, "proximate" refers to a position of two stamp components, or features thereof, that are in physical contact, adjacent to and/or optionally within 1000 microns of each other.

Incorporation of a reinforcement layer having an opening that vertically coincides with the relief features enables mechanically robust composite stamps having a thin (e.g., less than or equal to 500 microns) rigid support layer. This aspect of the present invention is useful for providing stamps capable of high yields of transferred elements and patterning of non-planar surfaces, such as contoured substrates or uneven substrates pre-patterned with device components. Thin rigid support layers of the present invention preferably have a relative high Young's modulus, for example a Young's modulus selected over the range of about 10 GPa to about 100 GPa. Use of a thin rigid support layer having a high Young's modulus and/or a high flexural rigidity is beneficial because it provides composite stamps having a lateral rigidity large enough to minimize distortions of the relief pattern which may occur upon formation of conformal contact between the stamp and the surface of a device substrate or donor substrate. The reduction in relief pattern distortion provided by incorporation of a thin rigid support layer having a high Young's modulus and/or high flexural rigidity enables effective transfer, assembly and/or integration of semiconductor structures having very small dimensions such as microscale and/or nanoscale structures. Certain embodiments, for example, incorporate a rigid support layer having a flexural rigidity selected over the range $10^{-3}$ Nm to 1 Nm, so as to provide a stamp exhibiting appropriate flexibility.

The composition and vertical dimensions (e.g., thickness) of the thin rigid support layer are properties that determine, at least in part, the overall conformability and flexural rigidity of the stamps of the present invention. In an embodiment, for example, the rigid support layer comprises a thin glass layer, for example, a thin layer comprising one or more glasses selected from the group of low cost soda-lime type glass, low coefficient of thermal expansion borosilicate type glass or preferably alkali-free aluminoborosilicate E-type glass commonly used in flat panel displays. In some embodiments, a thin rigid support layer has an average thickness in the region vertically corresponding to the printing region or receiving region of the stamp (e.g., the region having relief features) that is less than or equal to 500 μm for some embodiments, and optionally less than or equal to 300 μm. In an embodiment, the rigid support layer has a thickness, optionally in the region vertically corresponding to the printing or receiving region of the stamp, selected over the range of 100 μm to 300 μm, and optionally having an average thickness selected over the range of 300 μm to 500 μm. Use of a glass rigid support layer having a thickness less than or equal to 300 μm provides enhanced overall stamp conformability useful for high yield patterning of large substrate areas with microscale and/or nanoscale semiconductor elements. Optionally, the rigid support layer has a substantially uniform thickness, for example in the region of the receiving or printing surface of the stamp, with deviations from absolute uniformity of less than 20%, or less than 10% for some embodiments. Optionally, the rigid support layer is optically transparent, for example in the visible region of the electromagnetic spectrum, to allow optical alignment, registration and/or positioning by visualization through the composite stamp. In an aspect, the rigid support layer is a glass backplane, or other rigid and optically transparent material.

Reinforcement layers are positioned so as to mechanically support and strengthen the rigid support layer of the present composite stamps, thereby allowing use of thin rigid support layers. Optionally, reinforcement layers are positioned so as to provide mechanically robust coupling between the rigid support layer and components of an actuating system, such as a tool head and/or mounting flange of a stamping system. In an embodiment, for example, the reinforcement layer is connected to the top surface of the rigid support layer, the bottom surface of the rigid support layer or both the top and bottom surfaces of the rigid support layer. In an embodiment, for example, the reinforcement layer is at least partially disposed between at least a portion of the deformable layer and the rigid support layer. In an embodiment, for example, the reinforcement layer is at least partially embedded in the deformable layer. In an embodiment, the reinforcement layer is provided adjacent to the rigid support layer. As used herein "adjacent to" refers to a position directly adjacent to and in physical contact with the rigid support layer or a position wherein the reinforcement layer is connected to the rigid support layer.

In an embodiment, the reinforcement layer is described in terms of an area of overlap with the rigid support layer. "Area of overlap" refers to the portion of the rigid support layer for which there is vertical coincidence with the reinforcement layer. In an aspect, the area of overlap is confined to an outer surface area region of the rigid support layer, such as extending from the outer edge of the rigid support layer to within a specified distance. The extending distance is optionally selected from a range that is between 2 mm to 20 mm. Alternatively, the area of overlap is described in percentage terms relative to the surface area of the rigid support layer surface that faces the reinforcement layer (e.g., either the top surface or the bottom surface of the rigid support layer). In this aspect, the area of overlap is optionally greater or equal to than 5%, greater than or equal to 10%, greater than or equal to 25%. Alternatively, the area of overlap is described in terms of an absolute value, such as selected from a range that is between about 4 $cm^2$ and 180 $cm^2$. In an embodiment, the area of overlap is confined to an outer region of the rigid support layer, with an opening in the reinforcement layer that is centrally positioned and vertically coincident with at least a portion of centrally located plurality of relief features on the external surface of the deformable layer. In an embodiment the reinforcement layer extends substantially to the outer edge of the rigid support layer. In an embodiment, the area of overlap extends to the outer edge of the rigid support layer. In an embodiment, the area of overlap extends past the outer edge of the rigid support layer, such as continuing beyond the rigid support layer. In that embodiment, the reinforcement layer may facilitate mounting the stamp to a printing tool, for example.

The composition of the reinforcement layer determines, at least in part, the mechanical properties of composite stamps of the present invention. In an embodiment, the reinforcement layer comprises a fiber component, such as a fiber component that is glass fibers, polymer fibers, liquid crystal polymer fibers, carbon fibers or a mixture of fibers, or alternatively a particle component, such as nanoparticles or microparticles. Optionally, the reinforcement layer comprises a high tensile strength glass fiber component. In an embodiment, for example, glass fibers of the reinforcement layer are selected from the groups consisting of S-glass, S2-glass, E-glass. In an embodiment, the reinforcement layer comprises fibers provided in a woven configuration, for example, a layer of woven fiberglass or woven carbon fibers. In an embodiment, the reinforcement layer comprises one or more materials having a low coefficient of thermal expansion, for example, a coefficient of thermal expansion less than or equal to 5 PPM/K. In an embodiment, the reinforcement layer comprises materials having a coefficient of thermal expansion selected to match (e.g., to with 20%, 10% or 5%) the coefficient of thermal expansion of the reinforcement layer.

The physical dimensions, including shape, of the reinforcement layer are also selected to impart useful mechanical properties and performance capabilities of composite stamps of the present invention. In an embodiment, the reinforcement layer has an average thickness along the vertical dimension of the stamp selected over the range of 100 microns and 1000 microns. In an embodiment, the flexural rigidity of the reinforcement layer is selected so as to provide effective coupling of the rigid support layer and a component of an actuation system, such as a printing system. Reinforcement layers having a flexural rigidity that is at least ten times less than the flexural rigidity of the rigid support layer, for example, are useful for providing mechanically robust coupling to a tool head or mounting flange component of printing system such that mechanical failure is minimized, thereby achieving useful stamp lifetimes. In an embodiment, the reinforcement layer has a flexural rigidity selected over the range of $10^{-3}$ Nm to 1 Nm.

Reinforcement layers of the present invention may have a range of shapes selected to enhance in plane rigidity, increase stamp lifetime and protect the relatively thin support layer, while preserving the vertical flexibility, elasticity and conformability of the stamp's printable or active region. In some embodiments, the reinforcement layer has one or more openings (or voids) that vertically coincides with at least a portion of the receiving or printing surface of the stamp (e.g., the external face of the deformable layer having a plurality of relief features). Use of a ring shaped reinforcement layer, for example, provides functional benefits in the present invention such as increased placement accuracy, high transfer yield, and/or stamp lifetime. Although any shape can be used with the composite stamps provided herein, examples of reinforcement central orifice and/or reinforcement edge shapes include, but are not limited to, rings, squares, ellipse, circles and rectangles and arbitrary shapes having smooth, sharp or a combination of smooth and sharp edges, depending on the specific device and stamp configuration. In an embodiment, the opening of the reinforcement layer has a surface area greater than or equal to 10 $cm^2$. Alternatively, the opening area of the reinforcement layer is described in percentage terms relative to the surface area of the rigid support layer. In this aspect, the opening area is optionally greater or equal to than 75%, greater than or equal to 90%, greater than or equal to 95%.

Reinforcement layers of the present invention may have a spatially varying distribution of at least one mechanical property that beneficially impacts stamp performance. In some embodiments, for example, modulation of the Young's modulus in the vertical direction, flexural rigidity, or stiffness provided by the spatially varying distribution enables vertical flexibility while maintaining a useful degree of in-plane rigidity. In the context of a specific embodiment, a "spatially varying distribution" refers to a distribution of values of at least one mechanical parameter that varies selectively along one or more lateral dimensions of a stamp or component thereof. In some embodiments, the reinforcement layer has an distribution of Young's modulus, flexural rigidity or stiffness in the direction corresponding to the vertical dimension of the stamp (e.g., thickness) that varies selectively along a lateral dimension selected from the group consisting of the length, width, diameter or radius of the reinforcement layer. In an embodiment, the spatially varying distribution of Young's modulus or flexural rigidity is symmetrical about the center of the composite stamp along lateral dimensions, optionally with a minimum value at the center of the stamp and maximum values at the outer edges of the stamp. In an embodiment, the rigid support layer terminates laterally at one or more outer edges, and the Young's modulus or flexural rigidity of the reinforcement layer is larger proximate to the outer edges than regions of the reinforcement layer corresponding to the printing or receiving surface of the stamp (e.g., regions of the deformable layer having relief features). In an embodiment, for example, the reinforcement layer has a first region disposed between the relief features of the deformable layer and the rigid support layer and has a second region disposed between the outer edges of the rigid support layer and the deformable layer; wherein the Young's Modulus of the second region is larger than that of the first region.

In an embodiment, the reinforcement layer is only partially disposed between the deformable layer and the rigid support layer, and optionally has one or more openings or voids disposed between at least a portion of the relief features and the rigid support layer. In a specific embodiment of this aspect, the reinforcement layer is a ring, optionally having a thickness selected over the range of 200 microns to 500 microns, that is optionally positioned at least partially between the outer edges of the rigid support layer and the deformable layer. In an embodiment, the reinforcement layer is a woven fiberglass ring, and optionally the woven fiber glass ring is at least partially embedded in or otherwise integrated into the deformable layer. In an embodiment, any of the stamps disclosed herein have a reinforcement layer that is bonded to, or positioned at, an outer edge region of the support layer. In an aspect of this embodiment, the deformable layer is optionally bonded to or in direct contact with an inner region of the rigid support layer. This configuration is useful for constraining in-plane motion of the deformable layer by bonding to the rigid support layer. In some configurations, for example, the reinforcement layer has a central opening thereby allowing for direct bonding between the deformable layer and the rigid support layer. In some embodiments, the central opening or void is optically transparent, for example in the visible region of the electromagnetic spectrum, thereby allowing optical alignment, registration and/or positioning by visualization through the composite stamp.

Integration of the reinforcement layer in the present invention can be achieved by a range of composite stamp configurations. In certain embodiments, for example, the reinforcement layer is supported directly by, and optionally bonded directly to, the rigid support layer and/or the deformable layer. Alternatively, one or more intermediate layers, such as adhesive layers or other structural elements, are used for bonding the reinforcement layer, the rigid support layer and/or the deformable layer. In an embodiment, the reinforcement layer of a composite stamp is at least partially embedded in the deformable layer. Bonding between components in these embodiments may be provided by chemical bonding, for example involving covalent bonds, dipole-dipole interactions, hydrogen bonding, Van der Waals forces, London forces or any combination of these. Use of a fiberglass reinforcement layer in the present invention is beneficial because it is capable of establishing strong bonding with an elastomeric deformable layer (e.g., PDMS layer), thereby resulting in mechanical robust composite stamps exhibiting long lifetimes. In an embodiment, the reinforcement layer is shaped or selected so as to not interfere with optical alignment, registration and/or positioning by visualization through the composite stamp. For example, a reinforcement layer that is not optically transparent may be positioned so that the opening coincides with the region for which optical alignment, registration and/or positioning is visualized.

Deformable layers for some embodiments have a low Young's modulus, for example a Young's modulus selected over the range of about 0.5 MPa to about 10 MPa. Use of a low modulus deformable layer, such as an elastomer layer, is beneficial in the present invention because it provides composite stamps having the capability to effectively establish conformal contact with large areas (up to several m$^2$) of smooth surfaces, flat surfaces, uneven surfaces, rough surfaces, particularly surfaces having roughness amplitudes up to about 1 micron, and uneven surfaces, preferably surfaces having waviness of less 100 microns. In addition, use of a low modulus deformable layer allows conformal contact to be established between the contact surface of the stamp and large areas of a substrate surface using relatively low pressures (about 0.1 kN m$^{-2}$ to about 10 kN m$^{-2}$) applied to the stamp. Further, incorporation of a low modulus deformable layer provides useful release characteristics of the present composite stamps with a range of substrate surfaces.

In some embodiments, the deformable layer has a thickness selected over the range of 100 micron to about 500 microns. In some embodiments, the deformable layer is a polymer layer, and is optionally an elastomer layer, such as a poly(dimethylsiloxane) (PDMS) layer. Deformable layers of the present invention may have any pattern of relief features useful for a given printing, patterning and/or device fabrication application, for example having one or more stabilization features, pattern transfer features (e.g., transfer posts), registration features, and/or alignment features. Patterns of relief features useable in the present invention may comprise a singular continuous relief feature or a plurality of continuous and/or discrete relief features. In the present invention, selection of the physical dimensions of relief features or their arrangement in a relief pattern is made on the basis of the physical dimensions and relative arrangements of the structures to be assembled or otherwise generated on a substrate surface undergoing processing. Patterns of relief features useable in composite stamps of the present invention may comprise one or more relief features having physical dimensions selected over the range of about 10 nanometers to about 100 millimeters, preferably selected over the range of about 10 micrometers to about 1 millimeters for some applications. Patterns of relief features useable in the present invention may occupy a wide range of receiving or printing surface areas, for example receiving or printing surface areas selected over the range of about 1 cm$^2$ to about 10 m$^2$ are preferred for some applications. In an embodiment, the deformable layer has a plurality of pattern transfer features configured to allow sparse transfer and/or integration of semiconductor elements onto or into a device substrate. Optionally, the deformable layer is optically transparent, for example in the visible region of the electromagnetic spectrum, to allow optical alignment, registration and/or positioning by visualization through the composite stamp. In an aspect, the deformable layer is an optically transparent elastomeric layer.

Composite stamps of the present invention may be further characterized by one or more physical properties and/or functional capabilities. In an aspect, a composite stamp of the present invention has a net flexural rigidity selected from the range of $1\times10^{-3}$ Nm to 1 Nm. In an aspect, a composite stamp of the present invention has an average vertical direction Young's modulus that is between 0.5-10 MPa and an average in plane Young's modulus that is between 10-100 GPa. In an aspect, the stamps of the present invention have receiving or printing surfaces that experience a vertical bow (e.g., an unwanted localized vertical displacement) of less than about 100 μm, for an actuation force, such as for example an actuation force of less than or equal to 50 mPSI. In an aspect, the composite stamps of the present invention provide vertical bowing that is at least about 10 times less than the overall vertical displacement of the stamp. In an aspect, reinforced composite stamps of the present invention are capable of achieving a placement accuracy of printable elements that is better than ±4 μm at 3σ over a patterned substrate surface area of 9 cm$^2$ Adjacent layers or components of the present composite stamps may be bonded by any means known in the art of soft lithography and microfabrication. For example, bonding between the internal surface of the deformable layer and the rigid support layer or between the reinforcement layer and the rigid support layer may be provided using any composition, structure or bonding scheme providing a mechanically useful system capable of undergoing stretching and/or compression displacement encountered during dry transfer printing without mechanical failure, significant degradation or delamination. In one embodiment of this aspect of the present invention, bonding between at least a portion of the surfaces is provided by covalent and/or non covalent bonding. As used herein, bonding also includes embodiments wherein bonding is provided by an adhesive or laminating layer, or a coating or thin film provided between the surfaces. Useful adhesive layers include, but are not limited to, metal layers, polymer layers, partial polymerized polymer precursor layers, and composite material layers. Also included are chemically modified surfaces to facilitate bonding with the adjacent layer. In an aspect, any of the stamps provided herein have a deformable layer that is bonded to the support layer. In an aspect, the reinforcement layer is chemically bonded to the deformable layer, the support layer, or both.

The reinforced composite stamps of the present invention are useful for dry transfer contact printing, and particularly attractive for step-and-repeat printing involving printing to cover large area substrates. In an embodiment, a composite stamp of the present invention is specially designed to provide a clearance distance or a vertical offset distance. That distance provides a means for fixing or clamping the stamp to a printing tool head in a manner such that there is adequate clearance for mounting or positioning donor or target substrates having larger surface areas without interference from the tool head. In an aspect of that embodiment, the deformable layer further comprises an annular mounting flange and a flange connector. The flange connector operably connects the annular mounting flange to the stamp external surface so that the external surface and the mounting flange surface are in different planes separated by a clearance distance. In an aspect, the clearance distance is at least 200 μm, optionally at least 1 mm for some applications, and optionally at least 5 mm for some applications.

Further mechanical stability is optionally obtained by at least partially embedding the reinforcement layer in the flange connector. Optionally, the reinforcement layer traverses from next to the rigid support layer, along a plane parallel to the printable surface plane, up the flange connector and along a portion of the stamp mounting flange. In an aspect, the annular mounting flange and the flange connector are formed from the deformable layer material. In an embodiment, any of the stamps disclosed herein have a protruding reinforcement ring that anchors the support layer to the deformable layer, the reinforcement layer, or both.

Composite stamps of this aspect of the present invention are capable of establishing conformal contact between at least a portion of the printing and/or receiving surface(s) of the deformable layer and the substrate surface undergoing processing. Optionally, the composite stamp is operably connected to an actuator, such as a stamping device, for generating an external force capable of bringing the stamp into conformal contact with the substrate surface undergoing patterning. Optionally, the substrate may be operably connected to an actuator, capable of bringing the substrate into conformal contact with the composite stamp. Such actuators facilitate a controllable vertical displacement of the stamp useful for receiving structures from a donor substrate and/or printing structures from the stamp to a receiving surface.

In another aspect, the invention provides methods for making a reinforced composite stamp. In a specific embodiment of this aspect, a method for making a reinforced composite stamp comprises the steps of: (i) providing a master relief pattern having a selected three-dimensional relief pattern; (ii) providing a thin rigid support layer having a thickness that is less than 500 μm, and optionally less than 300 μm, said rigid support layer having a bottom surface and a top surface opposite said bottom surface, wherein the bottom surface of the rigid support layer faces the master relief pattern, thereby defining a bottom surface and a top surface of a stamp-forming chamber; (iii) providing a reinforcement layer in contact with the top surface or bottom surface of the rigid support layer, the reinforcement layer having an opening that vertically coincides with at least a portion of the master relief pattern; (iv) introducing to the stamp-forming chamber a prepolymer; (v) polymerizing the prepolymer, thereby generating a polymer layer in contact with the bottom surface of the rigid support layer, and optionally in contact with said reinforcement layer; and (vi) separating the polymer layer from the master relief pattern, thereby making the reinforced composite stamp comprising the polymer layer, the reinforcement layer, and the rigid support layer. In this process, the master relief pattern functions as a mold for the deformable stamp surface having a plurality of relief features. In a specific embodiment, the rigid support layer comprises a glass layer, such as a glass backing layer. In a specific embodiment, the steps of introducing and polymerizing a prepolymer generate an elastomer layer that provides the deformable layer of the reinforced composite stamp. A specific method of this aspect further comprises the step of at least partially embedding the reinforcement layer in the deformable layer.

In an embodiment, the relative position of the rigid support layer and the master relief pattern is adjusted to obtain a vertical separation distance between the rigid support layer and the master relief pattern. For example, the separation distance can be selected to be less than or equal to 1 mm, and optionally is controllably adjusted by the user, such as having a separation distance that can be initially set to a first distance, and then reduced to a second distance, thereby facilitating complete filling of the stamp-forming chamber cavity.

In an embodiment, the method for making the reinforced composite stamp further comprises the step of: (i) adjusting the relative position of the rigid support layer and the master relief pattern to obtain a vertical separation distance between the rigid support layer and the master relief pattern, wherein the separation distance is less than or equal to 1 mm. In an embodiment, the method for making the reinforced composite stamp further comprises the steps of: (ii) providing a wafer holder assembly, wherein the wafer holder assembly securably holds the master relief pattern; (ii) providing a stamp molding assembly, wherein the stamp molding assembly securably holds the rigid support layer; (iii) coupling the wafer holder assembly to the stamp molding assembly to provide a separation distance between the silicon master and the rigid support layer, wherein the separation distance is greater than or equal to 1 mm; (iv) introducing the prepolymer to the stamp-forming chamber via an inlet port positioned through one or both of the wafer holder assembly and stamp molding assembly, wherein the prepolymer is a degassed elastomer mixture; (v) exhausting the excess degassed elastomer mixture out of the stamp-forming chamber by decreasing the separation distance to a decreased separation distance; and (vi) decoupling the wafer holder assembly from the stamp molding assembly after the polymerization step. In an embodiment, for example, the step (v) of decreasing the separation distance decreases the separation distance 0.1 times to 0.6 times the original separation distance.

Any components and/or features of the reinforced composites stamps described herein may be incorporated into the present methods for making a composite stamp. In a specific method, for example, the rigid support layer is a glass backing having a thickness selected over the range of 200 microns to 500 microns. In a specific method, for example, the reinforcement layer is a shaped reinforcement layer having one or more openings, and optionally is a ring shaped structure, such as a ring of woven fiber glass. In an embodiment wherein the rigid support layer terminates laterally at one or more outer edges, the ring is disposed at least partially between the outer edges and the deformable layer.

In another aspect, the present invention provides devices and systems for making composite stamps. In an embodiment, the device is made from: a wafer holder assembly; a fastener operably connected to the wafer holder assembly for securing a master to the wafer holder assembly; a stamp mold assembly releaseably connected to the wafer holder assembly; an elastomeric holder that is connected to the stamp mold assembly for supporting a rigid backing, wherein the rigid backing has a surface that faces a surface of the master; vertical adjusters connected to the wafer holder assembly, the stamp mold assembly, or both, to provide a user-selectable separation distance between the master and the thin glass backing, wherein the separation distance is variable and selectable over a range that is greater than or equal to 100 μm and less than or equal to 3 mm; and one or more openings for introducing or exhausting a prepolymer to or from a stamp-forming chamber that is between the master and the rigid backing faces.

In an embodiment, the elastomeric holder comprises a chuck having an exhaust port, operably connected to a vacuum source for lamination of the rigid backing; and a shaped reinforcement layer supported by the rigid backing surface that faces the master. In an aspect, the rigid backing is glass, such as high-tensile glass having a thickness that is less than or equal to 500 μm.

In an aspect, the vertical adjusters comprise a plurality of fasteners (e.g., bolts, screws, etc.) that are mechanically coupled to each of the wafer holder assembly and stamp mold assembly to provide controllable and variable separation distance.

In another embodiment, the invention provides a printing tool device for dry transfer printing of semiconductors into or onto a target substrate, such as by incorporating any of the reinforced composite stamps of the present invention with a transfer printing tool head having a receiving surface that is connected to the reinforced composite stamp's mounting flange top surface. In an embodiment, the invention provides a printing tool device for dry transfer printing of semiconductors into or onto a target substrate, the device comprising: (i) a reinforced composite stamp extending laterally along lateral dimensions and vertically along a vertical dimension, the reinforced composite stamp comprising: (a) a deformable layer having an internal surface and an external surface positioned opposite the internal surface, the external surface of the deformable layer having a plurality of relief features; (b) a rigid support layer connected to the internal surface of the deformable layer, wherein the rigid support layer has a bottom surface and a top surface positioned opposite the bottom surface, wherein the bottom surface is positioned proximate to the internal surface of the deformable layer; (c) a reinforcement layer operably connected to the rigid support layer, the reinforcement layer having an opening that vertically coincides with at least a portion of the relief features of the external surface of the deformable layer; (ii) a mounting flange having a top surface; (iii) a vertical section that operably connects the mounting flange to the deformable layer external surface; and (iv) a transfer printing tool head comprising a receiving surface that is connected to the mounting flange top surface. In an embodiment of this aspect, the deformable layer, the rigid layer and the reinforcement layer are configured to provide the stamp having an anisotropic distribution providing flexibility along the vertical dimension and in-plane rigidity along the lateral dimensions of the composite stamp. In an embodiment, the reinforcement layer is at least partially connected to a bottom surface of the rigid support layer. In an embodiment, the reinforcement layer is at least partially connected to the top surface of the rigid support layer. In an embodiment, the reinforcement layer is at least partially connected to the bottom surface and a top surface of the rigid support layer.

The printing tool device can have a number of connection elements for securing the stamp to the tool head. For example, in an embodiment the connection between the stamp and the tool head comprises: a holding platform; and a fastener; wherein the fastener extends from the holding platform, through the stamp mounting flange to the receiving surface, thereby connecting the stamp to the tool head. Another example is a vacuum chuck for holding the stamp to the tool head. To facilitate increased vacuum binding, the vacuum chuck optionally has vacuum grooves positioned in the tool head receiving surface. In another aspect, the connection is facilitated by a holding platform that opposes the printing tool receiving surface, wherein the holding platform has a cavity that is at least partially filled by or at least partially contains the stamp mounting flange. Optionally, a fastener that extends through the receiving surface, the stamp mounting flange and at least partially through the holding platform provides a first-pass or a "rough" pre-alignment of the composite stamps. A portion of the holding platform contacts the vacuum grooves to provide reliable vacuum-mediated contact. The printing tool system optionally has a target substrate operably connected to the stamp, wherein the target substrate has a surface area that is greater than the printable surface area of the stamp.

In another aspect, the present invention provides methods of patterning, assembling and/or integrating semiconductor elements onto and/or into a substrate surface, such as the surface of a device substrate. In an embodiment, the invention provides a method for patterning a substrate surface with semiconductor elements comprising the steps of: (i) providing a reinforced composite stamp extending laterally along lateral dimensions and vertically along a vertical dimension, the stamp comprising: (a) a deformable layer having an internal surface and an external surface positioned opposite the internal surface, the external surface of the deformable layer having a plurality of relief features; (b) a rigid support layer connected to the internal surface of the deformable layer, wherein the rigid support layer has a bottom surface and a top surface positioned opposite the bottom surface, wherein the bottom surface is positioned proximate to the internal surface of the deformable layer; and (c) a reinforcement layer operably connected to the rigid support layer, the reinforcement layer having an opening that vertically coincides with at least a portion of the relief features of the external surface of the deformable layer; (ii) contacting the external surface of the deformable layer of the reinforced composite stamp and the semiconductor elements; thereby transferring at least a portion of the semiconductor elements to the external surface of the deformable layer; (iii) contacting the reinforced composite stamp having the semiconductor elements and the substrate surface in a manner exposing at least a portion of the semiconductor elements on the external surface to the substrate surface; and (iv) separating the reinforced composite stamp and the substrate surface, thereby transferring at least a portion of the semiconductor elements to the substrate surface and generating the pattern on the substrate surface. In an embodiment of this aspect, the deformable layer, rigid layer and reinforcement layer are configured to provide the stamp having an anisotropic distribution of Young's modulus or flexural rigidity providing flexibility along the vertical dimension and in-plane rigidity along the lateral dimensions of the composite stamp. A method of this aspect comprises a method for patterning a substrate surface, or otherwise transferring, assembling or integrating semiconductor elements into and/or onto a substrate surface, via dry transfer contact printing.

Patterning methods of this aspect of the present invention may include any feature or embodiment of the reinforced composite stamps disclosed herein. In a specific embodiment, for example, the step of contacting the reinforced composite stamp having the semiconductor elements and the substrate surface comprises establishing conformal contact between at least a portion of the external surface having the semiconductor elements and the substrate surface. In a specific embodiment, for example, the step of contacting the external surface of the deformable layer of the reinforced composite stamp with the semiconductor elements comprises contacting the relief features of the external surface and the semiconductor elements. In a specific embodiment, for example, the step of separating the reinforced composite stamp and the substrate surface comprises moving the reinforced composite stamp in a direction away from the substrate surface. In a specific embodiment, for example, the substrate surface has a surface area that is larger than the reinforced composite stamp printing surface area. In a specific embodiment, for example, a method of this aspect further comprises repeating the steps of: (i) contacting the external surface of the deformable layer of the reinforced composite stamp with the semiconductor elements; (ii) contacting the reinforced composite stamp having the semiconductor elements and the substrate surface; and (iii) separating the reinforced composite stamp and the substrate surface; wherein repeating the steps provides semiconductor elements to different regions of the substrate surface. In a specific embodiment, for example, the substrate surface is prepatterned with electronic devices or components of electronic devices.

In another aspect, the invention provides a composite stamp comprising: (i) an elastomer layer having an internal surface and an external surface positioned opposite the internal surface, the external surface of the elastomer layer having a plurality of relief features; (ii) a glass backing having a thickness less than or equal to 500 microns; the glass backing connected to the internal surface of the elastomer layer; wherein the glass backing has a bottom surface and a top surface positioned opposite the bottom surface, wherein the bottom surface is positioned proximate to the internal surface of the elastomer layer; and (iii) a reinforcement layer having a fiber component; wherein the reinforcement layer is connected to the bottom surface of the glass backing or the top surface of the glass backing, the reinforcement layer having an opening that vertically coincides with at least a portion of the relief features of the external surface of the elastomer layer. In an embodiment of this aspect, the reinforcement layer comprises woven fiber glass. In an embodiment of this aspect, the reinforcement layer is a ring; wherein the glass backing terminates laterally at one or more outer edges, where the ring is disposed at least partially between the outer edges and the elastomer layer. In an embodiment of this aspect, the reinforcement layer has an average thickness selected over the range of 100 microns to 500 microns. In an embodiment of this aspect, the glass backing layer has a flexural rigidity, and wherein the reinforcement layer has a flexural rigidity that is at least ten times less than the flexural rigidity of the glass backing. In an embodiment of this aspect, the reinforcement layer has a flexural rigidity selected over the range of $10^{-5}$ Nm to $10^{-2}$ Nm.

Without wishing to be bound by any particular theory, there can be discussion herein of beliefs or understandings of underlying principles or mechanisms relating to embodiments of the invention. It is recognized that regardless of the ultimate correctness of any explanation or hypothesis, an embodiment of the invention can nonetheless be operative and useful.

BRIEF DESCRIPTION OF THE DRAWINGS

FIGS. 1B and 1C are respectively optical image and scanning electron micrograph of the reinforced composite stamp schematically illustrated in 1A, respectively.

FIG. 2 provides schematic cross-sectional views of various transfer printing systems incorporating the composite stamps disclosed herein.

FIG. 5A show displacement vectors and FIG. 5B provide histogram plots of lateral displacement along x-direction (left side) and y-direction (right side).

DETAILED DESCRIPTION OF THE INVENTION

Figure 1A:
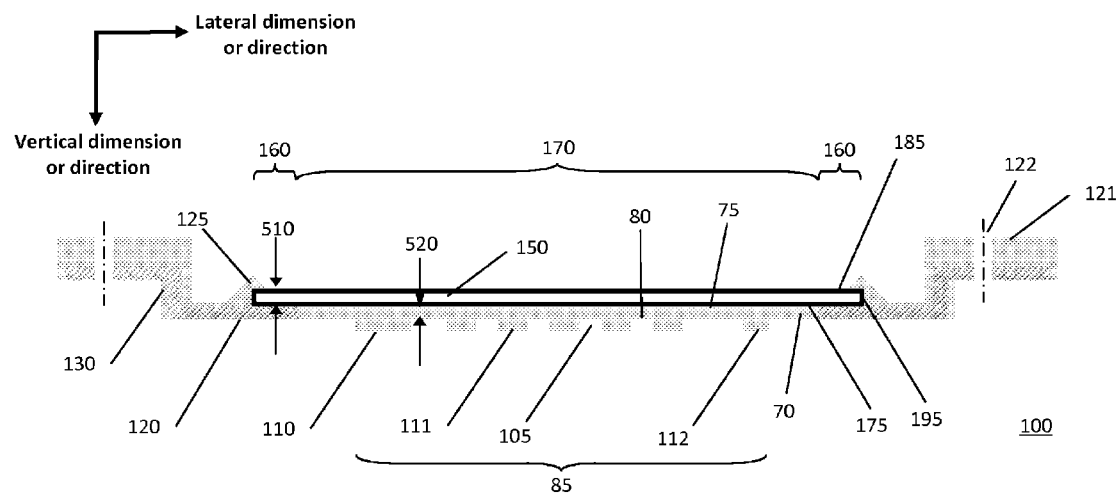
FIG. 1A provides a schematic cross-sectional view of a reinforced composite stamp.

Referring to the drawings, like numerals indicate like elements and the same number appearing in more than one drawing refers to the same element. In addition, hereinafter, the following definitions apply:

"Stamp" refers to a device component for transfer, assembly and/or integration of structures and materials via printing, for example dry transfer contact printing. Composite stamps of the present invention are particularly useful for pickup and release/print systems, wherein the stamp can be first laminated or contacted with a donor substrate to pickup micro- or nanostructures from that donor substrate and subsequently brought into contact with a receiving substrate to which it transfers the micro- or nanostructures. "Inked" refers to a stamp that has received micro- or nanostructures from a donor substrate. "Inking" refers to the step of pickup or transfer of micro- or nanostructures from a donor substrate to the stamp.

"Substrate" refers to a structure or material on which, or in which, a process is conducted, such as patterning, assembly and/or integration of semiconductor elements. Substrates include, but are not limited to: (i) a structure upon which semiconductor elements are fabricated, deposited, transferred or supported; (ii) a device substrate, for example an electronic device substrate; (iii) a donor substrate having elements, such as semiconductor elements, for subsequent transfer, assembly or integration; and (iv) a target substrate for receiving printable structures, such as semiconductor elements.

"Composite" refers to a structure, material, layer, or device that comprises more than one component, such as more than one material and/or phase. Disclosed herein are composite patterning devices or "composite stamps" made from a deformable layer and a rigid support layer, wherein the deformable and support layers have different chemical compositions and mechanical properties. The deformable layer optionally comprises a composite polymer layer comprising a combination of one or more polymer and a fiber, such as a glass or elastomeric fiber, particulate, such as nanoparticles or microparticles or any combinations of these.

"Reinforced composite stamp" refers to a composite stamp having a reinforcement layer. Incorporation of reinforcement layers in composite stamps of the present invention is useful for achieving high yield, reliable and accurate transfer printing of semiconductor elements. Incorporation of reinforcement layers is useful for achieving long stamp lifetimes, and facilitating conformal contact between stamps of the present invention and substrates.

"Layer" refers to an element of a composite stamp. Exemplary layers have physical dimensions and mechanical properties which provide composite stamps capable of fabricating patterns on substrate surfaces having excellent fidelity and good placement accuracy. Layers of the present invention may be a continuous or unitary body or may be a collection of discontinuous bodies, such as a collection of relief features or protrusions. Layers of the present invention may have a homogenous composition or an inhomogeneous composition. An embodiment of the present invention provides a composite patterning device or composite stamp comprising a plurality of layers, such as a polymer layer, a reinforcement layer and a rigid backing layer. Layers in the present invention may be characterized in terms of their thickness along a layer alignment axis which extends through a patterning device, such as a layer alignment axis which is positioned orthogonal to a plane containing one or more contact surfaces. Alternatively, layers such as the reinforcement layer may be characterized by their geometric shape including orifice area, shape and position relative to the printable area of the composite stamp.

"Deformable layer" refers to an layer of material which can be stretched or deformed and return to substantially its original shape without substantial permanent deformation. Deformable layers of the present invention include polymer layers, such as elastomer layers capable of undergoing substantially elastic deformations. Exemplary elastomers useful in deformable layers of the present invention may comprise polymers, copolymers, composite materials or mixtures of polymers and copolymers. Deformable layers may also include dopants and other non-elastomeric materials and components. Elastomers useful in the present invention may include, but are not limited to, PDMS, h-PDMS, polybutadiene, polyisobutylene, poly(styrene-butadiene-styrene), polyurethanes, polychloroprene and silicones.

"Reinforcement layer" refers to a material that imparts an additional influence on a desired mechanical property of the composite stamp, such as further reducing the deformable layer in-plane motion without adversely impacting vertical flexibility or elasticity. In an aspect, the reinforcement layer comprises a material that is distinct from the material of the deformable layer. In an aspect, the reinforcement layer corresponds to the deformable layer material, but whose polymer has been supplemented or doped with (i) fibers, such as glass fibers or polymeric fibers, (ii) particles, such as silicon particles and/or nanosized particles, and/or (iii) other structural enhancers. In addition, the reinforcement layer helps prevents delamination of stamp elements during high yield use of the stamp.

"Relief features" refer to protrusions, extensions or projections on the external surface of the deformable layer, such as a three-dimensional relief pattern, that facilitates dry-transfer printing of semiconductor elements from a donor substrate to a target substrate. In an aspect, the relief features of the deformable layer define a printable surface area. "Printable surface area" or "region" refers to that portion of the stamp used to transfer structures from a donor substrate to a target substrate. "Active surface region" is used interchangeably with "printable surface region."

"Rigid" refers to a mechanical property of a layer of the composite stamp that constrains in-plane deformation and unwanted motion of the deformable layer during any stage of transfer printing. For example, a "rigid support layer" that is operably connected to the deformable layer permits vertical flexibility of the deformable layer and also minimizes unwanted in-plane motion of the deformable stamp. "In plane" refers to a plane that is parallel to a plane defined by the printable area of the composite stamp. "Vertical" refers to a direction that is orthogonal to the plane defined by the printable area of the composite stamp.

"Vertically coincides" refers to an opening in the reinforcement layer that is positioned to encompass at least a portion of the relief features of the deformable layer (or the corresponding master mold from which the relief features are made), with the recognition that the opening and relief features are formed on different planes that are separated from each other by a vertical distance. In an aspect, all of the relief features vertically coincide with the opening in the reinforcement layer.

"Anisotropic distribution" refers to a physical parameter whose magnitude depends on the direction in which the parameter is measured. For example, the composite stamp is designed so that the deformable layer motion is more constrained in plane than in a vertical (e.g., orthogonal) direction. This can be expressed by any number of mechanical parameters such as Young's modulus, flexural rigidity, or stiffness.

"Coefficient of thermal expansion" refers to a parameter which characterizes the change in size that a material undergoes upon experiencing a change in temperature. Linear thermal expansion coefficient is a parameter which characterizes the change in length a material undergoes upon experiencing a change in temperature and may be expressed by the equation:

$$\Delta L = \alpha L_0 \Delta T \quad (I)$$

wherein $\Delta L$ is the change in length, $\alpha$ is the linear coefficient of thermal expansion, $L_o$ is the initial length and $\Delta T$ is the change in temperature. The present invention provides composite, multilayer patterning devices wherein thermal properties and physical dimensions of discrete layers are selected to provide a substantially symmetrical distribution of coefficients of thermal expansion about the center of the device along a layer alignment axis extending through the device.

"Vacuum chuck" refers to a holder that uses vacuum to hold objects, and is particularly useful for creating a reversible connection where two parts that are held together by the vacuum chuck are readily released from each other when the vacuum is removed.

"Lamination" refers to the process of bonding layers of a composite material or a process of producing contact between a first material or layer and a second layer or material (e.g, such as between the rigid backing and reinforcement layer, rigid backing and deformable layer, reinforcement layer and deformable layer, for example).

"Master" refers to shaped surfaces used to mold corresponding replicas in polymers. In an aspect, the master is a patterned silicon device having a three-dimensional relief pattern for generating a corresponding plurality of relief features in the deformable layer external surface. In this context, "external surface" of the deformable layer refers to the surface that is used to contact a donor and/or target substrate. Accordingly, internal surface of the deformable layer is that surface that makes contact with the rigid backing or the reinforcement layer.

"Placement accuracy" refers to the ability of a pattern transfer method or device to generate a pattern in a selected region of a substrate. "Good placement" accuracy refers to methods and devices capable of generating patterning in a select region of a substrate with spatial deviations from the absolutely correct orientation less than or equal to 5 microns, particularly for generating patterns of semiconductor elements on target substrates.

"Fidelity" refers to a measure of the similarity of a pattern transferred to a substrate surface and a relief pattern on a patterning device. Good fidelity refers to similarities between a pattern transferred to a substrate surface and a relief pattern on a patterning device characterized by deviations less than 100 nanometers.

"Young's modulus" is a mechanical property of a material, device or layer which refers to the ratio of stress to strain for a given substance. Young's modulus may be provided by the expression;

$$E = \frac{(\text{stress})}{(\text{strain})} = \left(\frac{L_0}{\Delta L} \times \frac{F}{A}\right); \quad (II)$$

wherein E is Young's modulus, $L_0$ is the equilibrium length, $\Delta L$ is the length change under the applied stress, F is the force applied and A is the area over which the force is applied. Young's modulus may also be expressed in terms of Lame constants via the equation:

$$E = \frac{\mu(3\lambda + 2\mu)}{\lambda + \mu};\qquad\text{(III)}$$

wherein $\lambda$ and $\mu$ are Lame constants. Young's modulus may be expressed in units of force per unit area, such as Pascal (Pa=N m$^{-2}$).

"Conformal contact" refers to contact established between surfaces and/or coated surfaces, which may be useful for fabricating structures on a substrate surface. In one aspect, conformal contact involves a macroscopic adaptation of one or more contact surfaces of a composite patterning device to the overall shape of a substrate surface. In another aspect, conformal contact involves a microscopic adaptation of one or more contact surfaces of a composite patterning device to a substrate surface leading to an intimate contact with out voids. The term conformal contact is intended to be consistent with use of this term in the art of dry transfer patterning. Conformal contact may be established between one or more bare contact surfaces of a composite patterning device and a substrate surface. Alternatively, conformal contact may be established between one or more coated contact surfaces, for example contact surfaces having a transfer material such as a semiconductor element and/or patterning agent deposited thereon, of a composite patterning device and a substrate surface. In some embodiments of the present invention, patterning devices of the present invention are capable of establishing conformal contact with flat surfaces. In some embodiments of the present invention, patterning devices of the present invention are capable of establishing conformal contact with contoured surfaces. In some embodiments of the present invention, patterning devices of the present invention are capable of establishing conformal contact with rough surfaces. In some embodiments of the present invention, patterning devices of the present invention are capable of establishing conformal contact with smooth surfaces.

"Flexural rigidity" is a mechanical property of a material, device or layer which refers to the ability of a material, device or layer to be deformed. Flexural rigidity may be provided by the expression:

$$D = \frac{Eh^3}{12(1 - v^2)};\qquad\text{(IV)}$$

wherein D is flexural rigidity, E is Young's modulus, h is thickness and v is the Poisson ratio. Flexural rigidity may be expressed in units of force multiplied by unit length, such as Nm.

"Polymer" refers to a molecule comprising a plurality of repeating chemical groups, typically referred to as monomers. Polymers are often characterized by high molecular masses. Polymers useable in the present invention may be organic polymers or inorganic polymers and may be in amorphous, semi-amorphous, crystalline or partially crystalline states. Polymers may comprise monomers having the same chemical composition or may comprise a plurality of monomers having different chemical compositions, such as a copolymer. Cross linked polymers having linked monomer chains are particularly useful for some applications of the present invention. Polymers useable in the methods, devices and device components of the present invention include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins or any combinations of these.

"Prepolymer" refers to a material that is capable of undergoing polymerization but that is in its unpolymerized liquid or gel state. Useful prepolymers are those of sufficiently low viscosity such that they are readily introduced to the stamp-forming chamber of the composite stamp generating devices disclosed herein.

"Elastomer" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, silicon containing polymers such as polysiloxanes including poly(dimethyl siloxane) (i.e PDMS and h-PDMS), poly(methyl siloxane), partially alkylated poly(methyl siloxane), poly(alkyl methyl siloxane) and poly(phenyl methyl siloxane), silicon modified elastomers, thermoplastic elastomers, styrenic materials, olefenic materials, polyolefin, polyurethane thermoplastic elastomers, polyamides, synthetic rubbers, polyisobutylene, poly(styrene-butadiene-styrene), polyurethanes, polychloroprene and silicones.

The terms "contact surface", "receiving surface" and "printing surface" refer to one or more surfaces of the composite stamps that contacts a substrate undergoing processing, for example during inking, transfer printing, assembly or integration processes. In some embodiments, for example, the external surfaces of the deformable layer provides one or more contact surfaces, receiving surfaces or printing surfaces of composite stamps of the present invention. In some embodiments, for example, relief features of the deformable layer provide one or more contact surfaces, receiving surfaces or printing surfaces composite stamps of the present invention.

As used herein the expression "semiconductor element" and "semiconductor structure" are used synonymously and broadly refer to a semiconductor material, structure, device and/or component of a device. Semiconductor elements include high quality single crystalline and polycrystalline semiconductors, semiconductor materials fabricated via high temperature processing, doped semiconductor materials, organic and inorganic semiconductors and composite semiconductor materials and structures having one or more additional semiconductor components and/or non-semiconductor components, such as dielectric layers or materials and/or conducting layers or materials. Semiconductor elements include semiconductor devices and device components including, but not limited to, transistors, photovoltaics including solar cells, diodes, light emitting diodes, lasers, p-n junctions, photodiodes, integrated circuits, and sensors "Semiconductor" refers to any material that is a material that is an insulator at a very low temperature, but which has a appreciable electrical conductivity at a temperatures of about 300 Kelvin. In the present description, use of the term semiconductor is intended to be consistent with use of this term in the art of microelectronics and electronic devices. Semiconductors useful in the present invention may comprise element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electronic properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light emitting materials, such as light emitting diodes (LEDs) and solid state lasers. Impurities of semiconductor materials are atoms, elements, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

"Operably connected" refers to a configuration of layers and/or device components of composite patterning devices of the present invention such that functionality of the components or layers are preserved when connected. Operably connected layers or device components, refers to an arrangement wherein a force applied to a layer or device component is transmitted to another layer or device component. Operably connected layers or device components may be in contact, such as layers having internal and/or external surfaces in physical contact. Alternatively, operably connected layers or device components may be connected by one or more connecting layers, such as thin metal layers or reinforcement layers, positioned between the internal and/or external surfaces of two layers or device components, or that run between two or more layers or components. In an embodiment, a rigid layer and a reinforcement layer are "operably connected" such that the stamp with the reinforcement layer is capable of withstanding a higher activation force without bowing or having the rigid layer fracturing or otherwise damaged compared to a stamp without the reinforcement layer.

In the following description, numerous specific details of the devices, device components and methods of the present invention are set forth in order to provide a thorough explanation of the precise nature of the invention. It will be apparent, however, to those of skill in the art that the invention can be practiced without these specific details. For example, thus the scope of the invention should be determined by the appended claims and their equivalents, rather than by the examples given.

An important design consideration in developing stamps for dry transfer contact printing applications is minimizing mechanical distortions induced by thermal contraction during stamp fabrication or application of in-plane stress forces during printing processes. Such distortions can significantly impact the fidelity and accuracy of the printing. In addressing these considerations, it was discovered that a thin glass backing material can be effectively integrated into a composite stamp for the purpose of preventing in-plane mechanical deformation of the stamp. When the thickness of the glass backing layer is less than 300 µm thick (e.g., about 100 µm to 200 µm thick), the elastomeric stamp can conform to the surface of uneven substrates such as flexible plastic substrates and substrate prepatterned with electronic devices and components. Such thin glass backing sheets are relatively fragile, and therefore, may be subject to mechanical failure during printing. This attribute impedes use of thin glass backing materials in conventional composite stamps for dry transfer contact printing.

To address this limitation, a reinforcement layer is incorporated into a composite stamp of the present invention that effectively mitigates the fragility concern, while retaining the performance benefits accessed by use of a thin glass backing. In an embodiment, for example, a two-step molding process allows fabrication of the composite stamps in a reliable manner that addresses the fragility issue. First, a thick polydimethylsiloxane (PDMS) cylindrical block is molded using an aluminum mold as described hereinafter. This thick PDMS block is used to temporarily hold the thin glass backing sheet during the composite stamp molding process as discussed in more detail hereinafter. A reinforcement layer (e.g., fiberglass) is added to improve the mechanical properties and placement repeatability with printing by the reinforced composite stamps.

Figure 3:
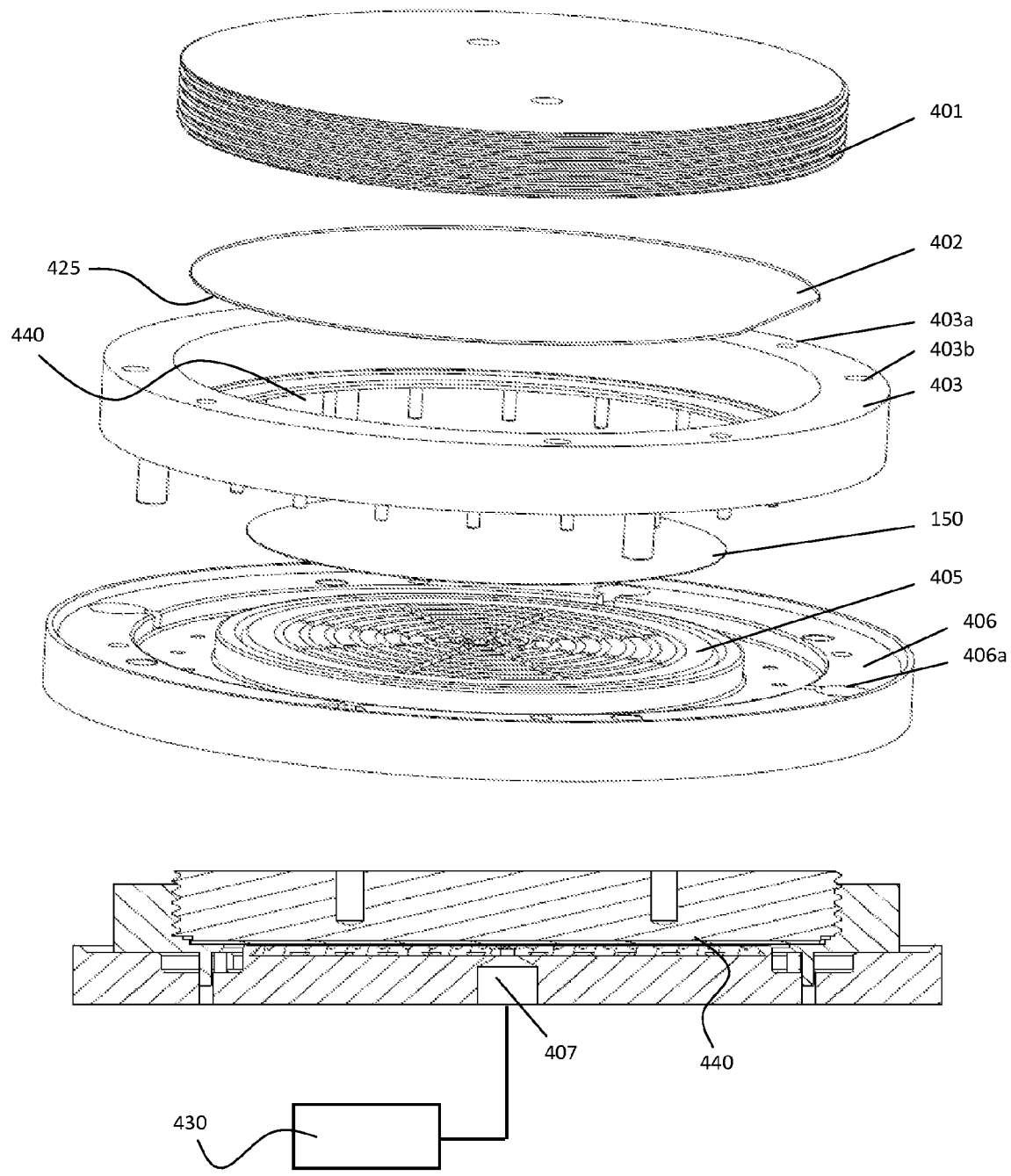
FIG. 3 is a schematic view of a system of the present invention for molding a reinforced composite stamp of the present invention.
Figure 4:
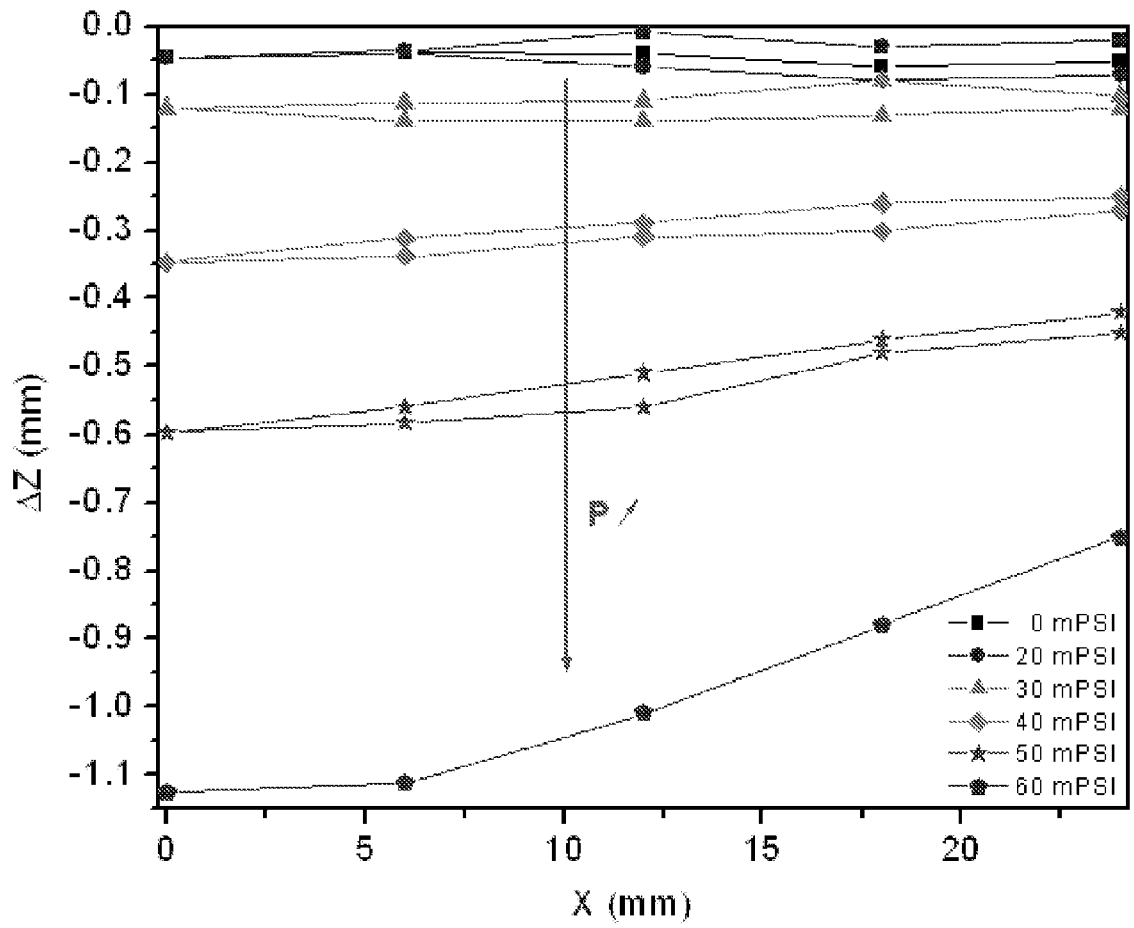
FIG. 4 provides measurements of the profile of a reinforced composite stamp that is subject to increasing levels of applied pressure to the stamp backing layer. Plotted is a measure of vertical displacement (mm) as a function of radial stamp position (mm).
Figure 5:
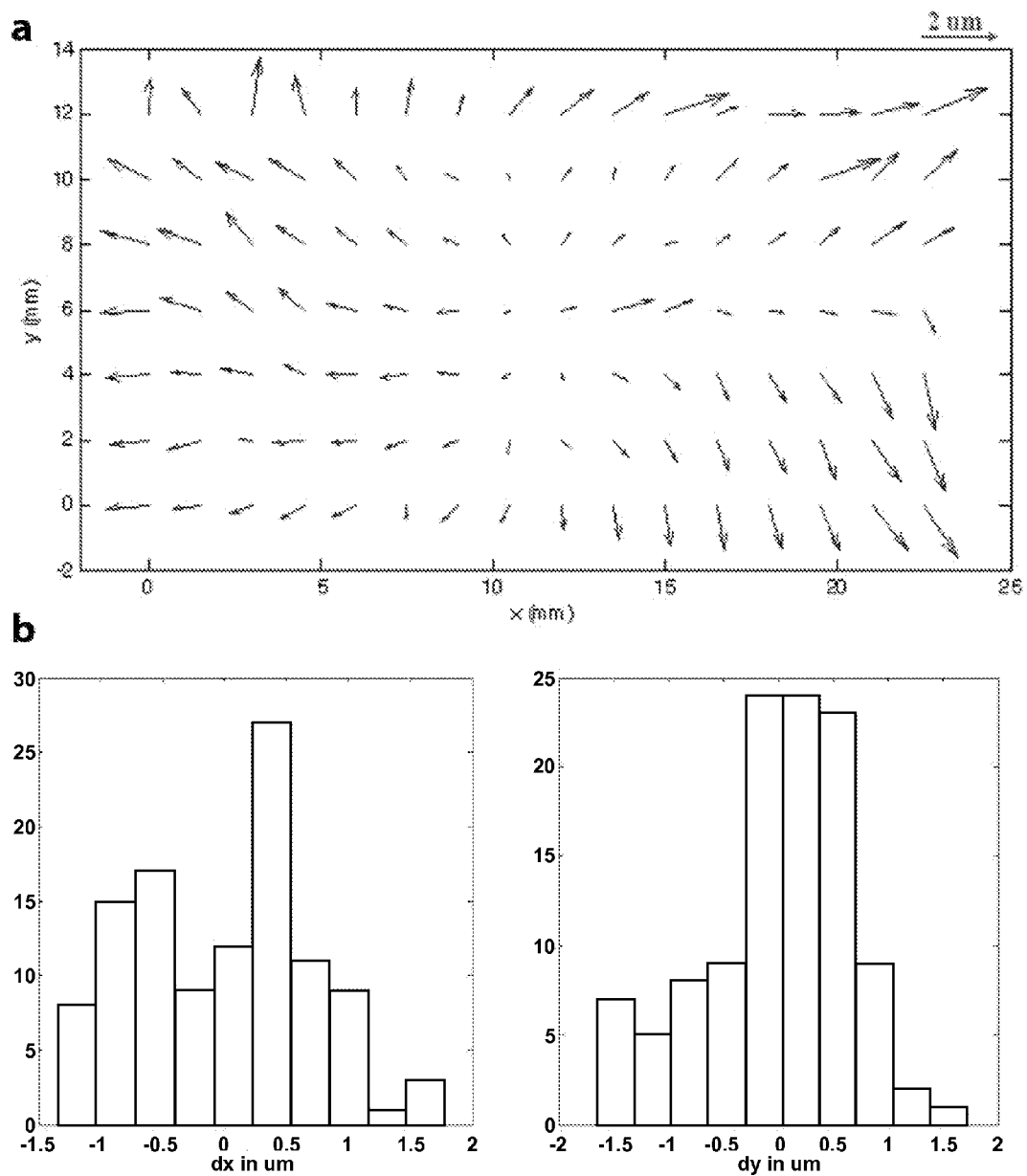
FIG. 5 illustrates in-plane distortion measurements across a reinforced composite stamp, laminated against its own master.

Various features and strategies are employed to develop a viable and advantageous reinforced stamp, printing devices and devices for making the reinforced composite stamps. FIGS. 1 through 3 detail aspects of the reinforced composite stamp, printing devices and devices for making the reinforced composite stamps. The systems are subjected to various testing and printing and FIGS. 4 through 6 summarize results of exemplary tests and indicate the systems achieve consistent accuracy, reliability and satisfy various other desired objectives.

The invention may be further understood by the following non-limiting examples.

Example 1

Reinforced Composite Stamps

FIG. 1A provides a schematic cross-sectional view of an exemplary reinforced composite stamp 100 of the present invention. As shown in FIG. 1A, the composite stamp comprises a deformable layer 70, a reinforcement layer 120, and a rigid support layer 150. An array of relief features 105 are defined on the external surface 80 of the deformable layer 70 to facilitate selective transfer of printed structures, such as semiconductor elements. Array of relief features 105 may comprise a relief pattern providing selective printing or patterning functionality. External surface 80 is the surface of deformable layer 70 configured such that it is that is capable of contacting donor or target substrates for dry-transfer printing processes, for example providing a contact surface, printing surface or receiving surface of stamp 100 for dry transfer contact printing. The deformable layer 70 also has an internal surface 75 that faces rigid support layer 150. As shown in FIG. 1A, internal surface 75 is connected to the rigid support layer 150 and configured such that it does not directly contact a donor or target substrate during printing processing. In an embodiment shown in FIG. 1A, deformable layer 70 is an elastomer layer and rigid support layer 150 is a thin glass backing of composite stamp 100. Rigid support layer 150 has bottom surface 175, top surface 185, and outer edges 195. Optionally, reinforcement layer 120 is positioned on top of rigid support layer 150 (e.g., facing top surface 185). Optionally, reinforcement layer 120 connected to both the top surface 185 and bottom surface 175 of rigid support layer 150. Optionally, reinforcement layer is disposed at least partially between the deformable or elastomer layer 70 and outer edge 195 of rigid backing layer 150, such as by continuing past outer edge 195 toward a stamp mounting element, such as mounting flange 121.

In the exemplified embodiment shown in the figures, reinforcement layer 120 is connected to the bottom surface 175 of rigid support layer 150 and has an opening 197 (schematically illustrated in FIG. 1B with a dashed line) that is vertically coincident to the plurality of relief features 105. The area of overlap between the reinforcement layer and the rigid support layer corresponds to the surface area of outer edge region 160.

The composite stamp 100 is reinforced with the reinforcement layer 120 positioned such that it is partially disposed between deformable layer 70 and rigid support layer 150. Reinforcement layer 120 is configured to support and provide reinforcement to rigid support layer 150, thereby conferring enhanced overall mechanical stability and stamp lifetime. In an embodiment, reinforcement layer 120 is a ring of woven fiberglass that is only partially disposed between the deformable layer 70 and the rigid support layer 150. As shown in FIG. 1A, reinforcement layer 120 is bonded to the outer edge region 160 of rigid support layer 150, and deformable layer 70 is bound to a central region 170 of rigid support layer 150. In this example, central region 170 corresponds to the area of opening 197 in the reinforcement layer 120. In an embodiment, reinforcement layer 120 is embedded in deformable layer 70. As also shown in FIG. 1A, composite stamp 100 is operably connected to an annular mounting flange 121 such that reinforcement layer 120 and/or deformable layer 70 bridges the gap between the rigid support layer 150 and the annular mounting flange 121. In an embodiment, the annular mounting flange 121 is populated with a circular array of mounting or registration features such as cylindrical perforations 122.

The direction of "lateral" and "vertical" is illustrated in FIG. 1A by the arrows labeled with the relevant dimension or direction description. In an embodiment where the composite stamp and rigid backing is generally circular, the lateral dimension or direction corresponds to the radial dimension or direction. The rigid backing thickness is labeled 510 and is the distance between the ends of the two associated facing arrows. The thickness of the deformable layer is labeled 520 and is the distance between the ends of the two associated facing arrows. In this aspect, the deformable layer thickness corresponds to the separation distance between the uppermost relief feature on a mold used to form the relief features and the rigid backing. Optionally, deformable layer thickness is described in terms of thickness 520 plus the height of a relief feature on the deformable layer.

In a specific embodiment, relief features 105 of deformable layer 70 are defined via a molding process using a master wafer mold (e.g., see 402 of FIG. 3) that is patterned with a desired three-dimensional relief pattern. For example, the master mold pattern is optionally obtained by a photo-defined pattern in a 5 to 100 μm photo-resist layer on the surface of a mechanical grade silicon wafer. Depending on their function, relief features 105 are provided with physical dimensions and positions selected to serve a number of functions useful for printing-based processing, including, but not limited to, stabilization patterns 110 for stabilizing the printable area or printing surface area 85, transfer posts 111 to facilitate lift-off and release of printed elements, anti-sagging posts 112 to minimize stamp sagging, and alignment or registration features (not shown, such as lock-and-key features) for enhancing stamp alignment during printing.

In an aspect, the reinforcement layer 120 is positioned to contact the rigid support layer 150 at an outer edge region 160 (e.g., the reinforcement layer extends into the rigid support layer outer edge region by a distance corresponding to 160). The portion of deformable layer 70 that is positioned inside the reinforcement layer 120 (e.g., within opening 197) is referred to as the inner region 170. The relative positions of the outer edge region 160 and inner region 170 is selected for a specific processing application. In an embodiment, for example, outer edge region 160 and inner region 170 are selected such that a substantial portion of the printing region 85 is vertically coincident to opening 197 so as to provide optical transparency and vertical flexibility of printing region 85 while reinforcement layer 120 maintains in-plane rigidity and mechanical robustness of composite stamp considering the fragility of the rigid support layer 150 (e.g., less than about 300 μm thick). In an aspect, the outer edge 160 is entirely outside the printing surface area 85, such as a printing surface area that is defined by the outer footprint of array of relief features 105. In an aspect, the outer edge region is defined as a range of outermost surface area of the rigid support layer 150, such as the outermost surface area that comprises less than 20%, less than 10% or less than 5% the surface area of the rigid support layer surface that faces the reinforcement layer (e.g., the top or bottom surface of the rigid support layer).

An important optional feature of a reinforced composite stamp is the ability to contact donor or target substrates having a larger surface than the reinforced composite stamp. A number of composite stamps and related printing systems known in the art are designed to interact with surfaces that are equal or less than the surface area of the composite stamp. This is a significant disadvantage for step-and-repeat processing where the stamp is used to repeatedly print to a large area of a target substrate. One design strategy for ensuring adequate clearance between the composite stamp (and particularly the print tool head to which the stamp is mounted) is illustrated in FIG. 1A. In this example design, the vertical section or flange connector 130 enables the stamp patterned surface 105 to be located in a recessed plane. This stamp configuration provides a number of benefits, including: (i) facilitating mounting of the stamp by providing geometrical clearance, (ii) and enhancing out-of-plane vertical motion of the stamp's printing surface useful for establishing conformal contact with a substrate surface. As shown in FIG. 1A, a protruding reinforcement ring 125 is also provided to reduce mechanical stress at the interface between the deformable layer 70 and edge of internal surface 75 and the edge of the rigid support layer 150

Further referring to FIG. 1A, rigid support layer 150 has a composition and physical dimensions provided to prevent in-plane mechanical deformations of the stamps in the lateral direction. This configuration ensures that mechanical distortions induced by thermal contraction during stamp fabrication or application of in-plane stress forces during printing are minimized. In some embodiments, the rigid support layer 150 is a glass layer having a thickness selected to be less than 500 µm thick, and optionally a thickness of 100 to 300 µm. Use of such a thin rigid support layer 150 comprising a glass layer as provided in the reinforced configuration shown in FIG. 1A is useful to achieve the capability to conform to the surface of uneven substrates such as flexible plastic substrates and substrates prepatterned with devices and components, while minimizing in-plane deformation during printing that can undermine transfer accuracy and pattern fidelity.

Figure 1B:
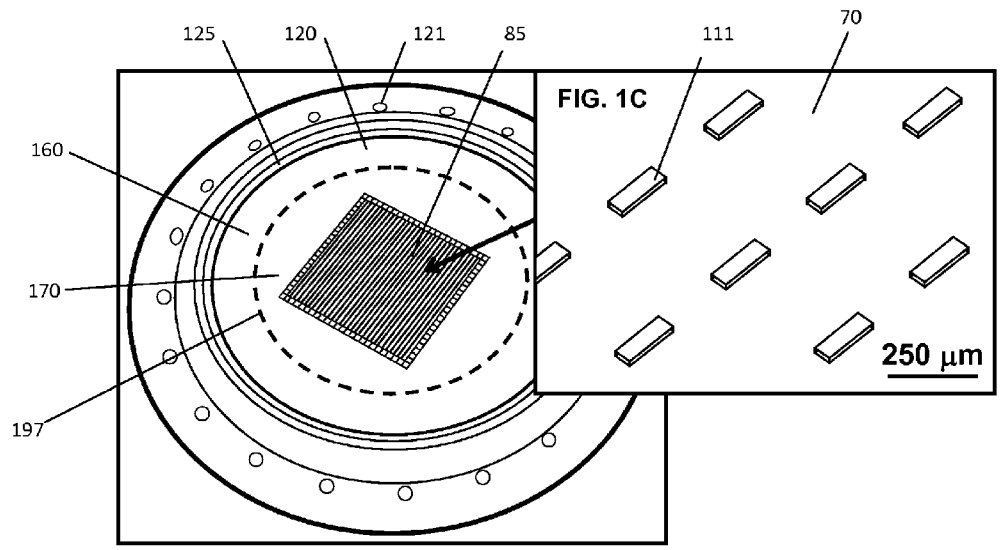

FIGS. 1B and 1C, respectively, provide an optical image and a scanning electron micrograph of reinforced composite stamps. As shown in FIGS. 1B and 1C, the reinforced composite stamp has a pattern of relief features comprising a plurality of posts having a rectangular cross section. The physical dimensions of the posts of reinforced composite stamp shown are: length=185 microns, width=50 microns and thickness=20 microns. The posts are provided in a 30×30 mm array arrangement with an average distance between adjacent posts equal to 370 microns. The composite stamp glass backing is round shaped with an overall diameter of 76.2 mm and a thickness of 200 microns. The woven glass fiber ring reinforcement consist of Style 120 E-Glass fiberglass fabrics having a weight density of ~30z/Yd$^2$, and an average thickness of 90-115 µm, with a 4-Harness Satin style weave pattern. The reinforcement ring is laser cut into a perforated ring shape having the following physical dimensions: inner diameter of 54 mm, outer diameter of 120 mm, holes diameters of 2 mm.

Example 2

Devices for Printing Using Reinforced Composite Stamps

FIGS. 2A-D provides a schematic cross-sectional view of a reinforced composite stamp illustrating different examples of how a stamp of FIG. 1 is attached to a transfer printing tool head apparatus 300. Such a system can be used for a wide variety of printing methods, including dry transfer printing methods related to conformal contact with a target or a donor substrate, illustrated by 400 in FIG. 2C, where the dashed lines indicate the target or donor substrate extends and has a surface area that is larger than the printable area 85 or surface area of deformable layer 70. In each of the exemplified embodiments, the stamp and mounting design ensures there is adequate clearance distance 320 between a target substrate 400 positioned in contact with the relief features and the apparatus to which the stamp is mounted, thereby facilitating printing to a target substrate that has a surface area that is larger than the printable surface area of the composite stamp.

Figure 2A:
FIG. 2A shows a transfer printing tool head apparatus having a metal ring and metal screws that secures the composite stamp.

FIG. 2A illustrates a reinforced composite stamp that is connected to the print tool head 300, and specifically the tool head receiving surface 310 by a fastener 201 (exemplified by a metal screw) that extends through holding platform 200, stamp flange 121 and tool receiving surface 310. In the aspect where the fastener is a screw, the receiving surface is threaded to secureably receive the screw. Alternatively, the fastener is oriented in the other direction, such that it extends through the tool head apparatus and at least partially through the holding platform 300.

Figure 2C:
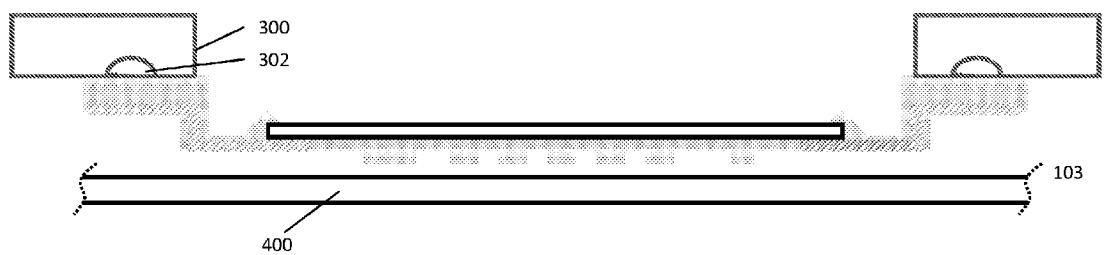
FIG. 2C shows a composite stamp vacuum-chucked to a transfer printing tool head apparatus without an intermediate metal apparatus.
Figure 2D:
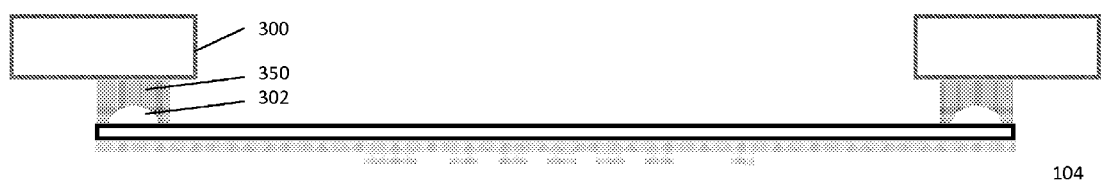
FIG. 2D shows a composite stamp vacuum-chucked to a transfer printing tool head apparatus by an intermediate elastomeric interposer.
Figure 2B:
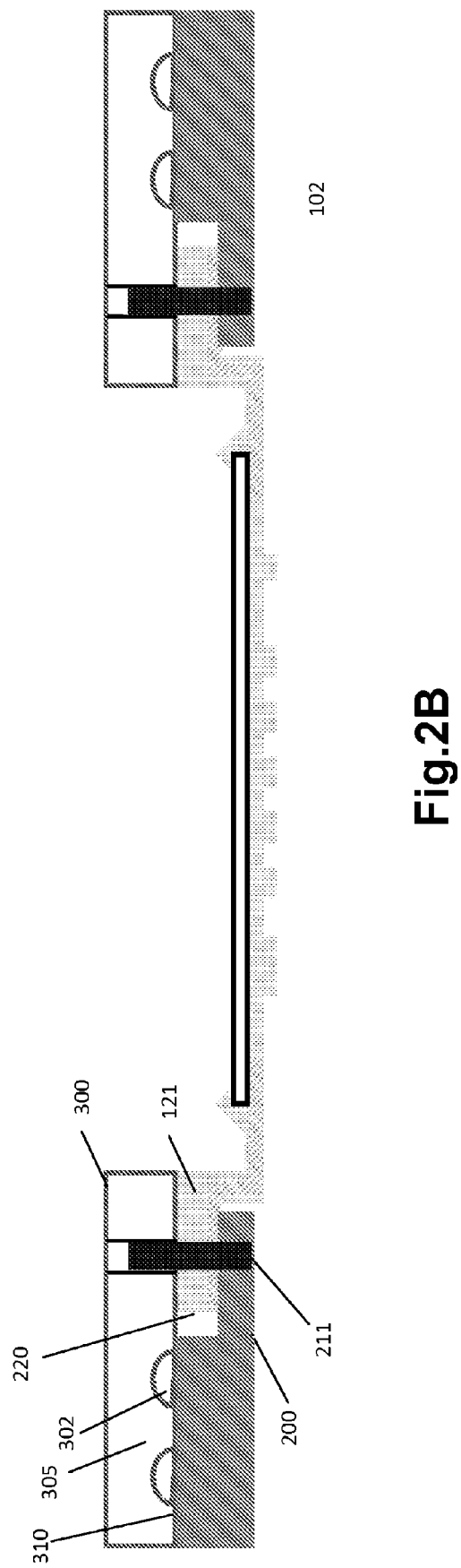
FIG. 2B shows a composite stamp vacuum-chucked to a transfer printing tool head apparatus by an intermediate metal apparatus.

FIG. 2B is a schematic cross-section showing the reinforced composite stamp vacuum-chucked to a transfer printing tool head apparatus (300). A vacuum chuck 305 is operably connected to vacuum grooves 302 to hold an upper portion and a lower portion positioned on either side of the stamp flange 130. In this example, a holding platform 200 is shaped to have a holder receiving chamber 220 in which flange 121 is at least partially disposed. A portion of the holder 200 contacts vacuum chuck 305 vacuum grooves (302) defined on the receiving surface 310 of the tool head 300. An optional fastener 201 is shown as a dowel pin. For further stability, the dowel pins 201 are arranged in a circular array to provide a first-pass pre-alignment of the composite stamps.

FIG. 2C is a schematic cross-section of a reinforced composite stamp vacuum-chucked to a transfer printing tool head apparatus (300). In this configuration vacuum grooves (302) are defined on the receiving surface 310 of the tool head apparatus (300). The composite stamp mounting flange 121 is directly vacuum chucked to the tool head apparatus 300 (compare to FIG. 2B where the vacuum chuck directly vacuums holding platform 200).

FIG. 2D is a schematic cross-section of a reinforced composite stamp vacuum-chucked to a transfer printing tool head apparatus (300). In this configuration, vacuum grooves (302) are defined in an intermediate elastomeric holder (350) to provide a 'soft' mechanical connection between the tool head 300 and the reinforced composite stamp.

Example 3

Devices for Making Reinforced Composite Stamps

Provided herein are examples of systems and processes that can be used to make reinforced composite stamps of the present invention. FIG. 3 is a schematic illustration of a set of parts used in the process of making or molding reinforced composite stamps. One example of the steps used to make a reinforced composite stamp are as follows:

A master 402, for example a patterned master is fabricated using standard techniques, such as a UV photo-lithographic process (as described in published lithography literature; see, e.g., US Pat. Pub. No. 20060286785 to Rogers et al.). In an embodiment, master 402 is a patterned silicon wafer having relief features corresponding to the relief feature pattern desired for the deformable stamp patterned surface.

The master 402 is placed with the surface 425 having the relief feature pattern facing down in a wafer holder subassembly 403. An example wafer holder subassembly 403 is machined stainless steel. As shown in FIG. 3, the wafer holder subassembly 403 has vertical adjusters 403a and 403b, such as orifices for receiving adjustment bolts, for example, to provide controlled separation. A fastener 401, depicted as a machined Teflon block is then screwed-in to secure in place the master 402 in the wafer holder 403. Other fasteners may be employed to hold the master in place including, but not limited to, clamps, levers, springs, screw-plates, etc.

A rigid support layer 150, such as a thin glass wafer, is placed on the surface of a holder. Examples of useful holders for this aspect include an elastomeric holder or elastomeric chuck 405 that is a sub-part of the stamp mold subassembly 406. A vacuum line is briefly connected to the vacuum chuck exhaust port 407 in order to insure a proper lamination of the thin (e.g., ~100 to 500 µm) rigid support layer 150, depicted in FIG. 3 as a glass disk. A reinforcement layer 120, such as a ring of woven fiberglass, is placed onto the thin glass disk.

The wafer holder subassembly (e.g., fastener 401, master 402, holder 403) is coupled to the stamp mold subassembly 150, 405-407. A set of vertical adjusters all around wafer holder 403, shown as bolts 403a and 403b are adjusted to maintain a greater than about 1 mm separation gap between the master surface 425 and the surface of the rigid support layer surface 150.

As shown in FIG. 3, the combined assembly of the wafer holder subassembly 401-403 and stamp mold subassembly 404-407 is placed inside a modified vacuum dessicator containing a plastic cup filled with freshly mixed 2-part elastomer mixture (also referred herein as "prepolymer" mixture). Other means of introducing the elastomer mixture can be used. The plastic cup is mechanically coupled to a vacuum sealed rotary drive which enables the operator to empty the plastic cup under vacuum. The dessicator is connected to a vacuum line in order to remove air and degas the elastomer 2-part mixture.

The degassed elastomer mixture or prepolymer is introduced to the stamp-forming chamber 440 that is between said master and said rigid backing faces via the openings 406a in the stamp mold subassembly (illustrated as ports). The dessicator is vented to air and the combined wafer—stamp mold assembly of the wafer holder is removed.

The adjustment bolts 403a are un-screwed and the set of bolts 403b are tightened in order to bring the silicon master in close proximity (e.g., ≦500 μm) with the thin glass backing. During this process, any excess elastomer mixture exhausts through the stamp mold assembly openings or ports 406a. Hard-stop spacers built in the stamp mold subassembly enable a fine control of the final separation gap.

The elastomer mixture is cured inside an oven, for example by following the elastomer manufacturer's recommendations. Conventional ovens, ultraviolet rays, infrared rays and other means for curing as appropriate for the particular prepolymer mixture in the stamp-forming chamber are employed.

The resultant cured elastomer mixture that makes up the reinforced composite stamp is taken out of the oven, cooled in air at room temperature or in a cooled environment. The set of bolts 403a and 403b are loosened to separate the wafer holder subassembly 401-403 and the stamp mold subassembly 404-407. The vacuum chuck exhaust port 407 is briefly connected to a pressurized $N_2$ gas line in order to facilitate the separation of the reinforced composite stamp from the stamp mold subassembly.

Example 4

Experimental Results

FIG. 4 provides measurements of the profile of a reinforced composite stamp of the invention subject to different pressure applied to the stamp's rigid support layer. In this experiment, the rigid support layer is a glass backing disk with a thickness of ~100 μm. This graph was obtained by recording the focal plane position using a high resolution CCD camera and by maintaining the camera focus point on the stamp patterns. These results confirm that the composite stamp active or printing area (i.e., where the transfer posts are located) follows a planar vertical motion with minimal out-of-plane bow deformation for actuation pressure forces up to 50 mPSI.

FIG. 5 provides in-plane distortion measurements across a reinforced composite stamp of the invention laminated against its own master. A composite stamp with an array of 50×50 μm posts was fabricated and mounted on a transfer printing tool head. The stamp was precisely aligned optically and laminated on the silicon master wafer which was used to fabricate the stamp. While the composite stamp was laminated on its master, an array of high resolution optical images was recorded to capture local misalignments between the composite stamp and its master. These images were then processed using an image analysis algorithm developed using Matlab image processing toolbox. The extracted local misalignment data are presented in FIG. 5 as quiver (FIG. 5A) and histogram plots in the x-direction (FIG. 5B) and y-direction (FIG. 5C). In order to quantify the stamp placement accuracy a specific test procedure was developed. The motion algorithm of the tool printing head was optimized in order to obtain consistent stamp laminations and de-laminations.

Figure 6A:
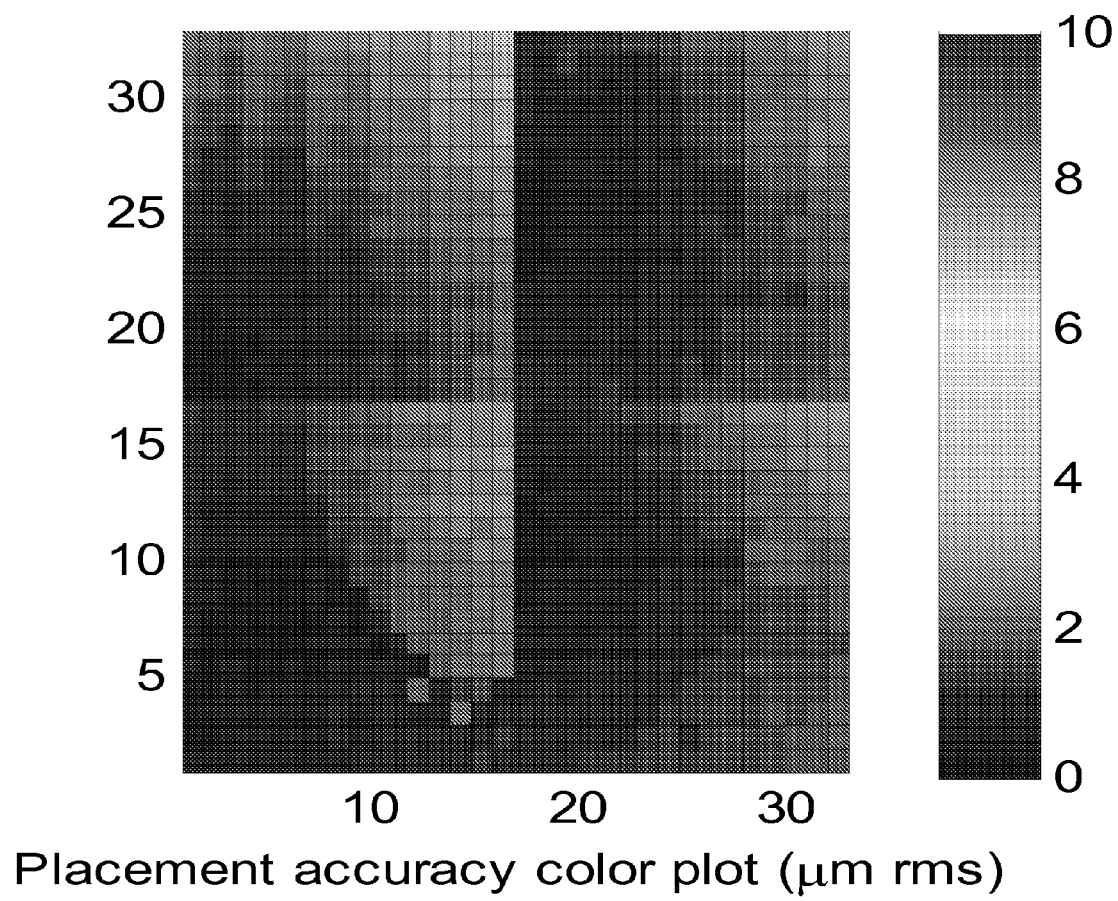
FIGS. 6A and B provide plots of placement accuracy measurements of silicon chiplets transferred onto a target substrate using a reinforced composite stamp.
Figure 6B:
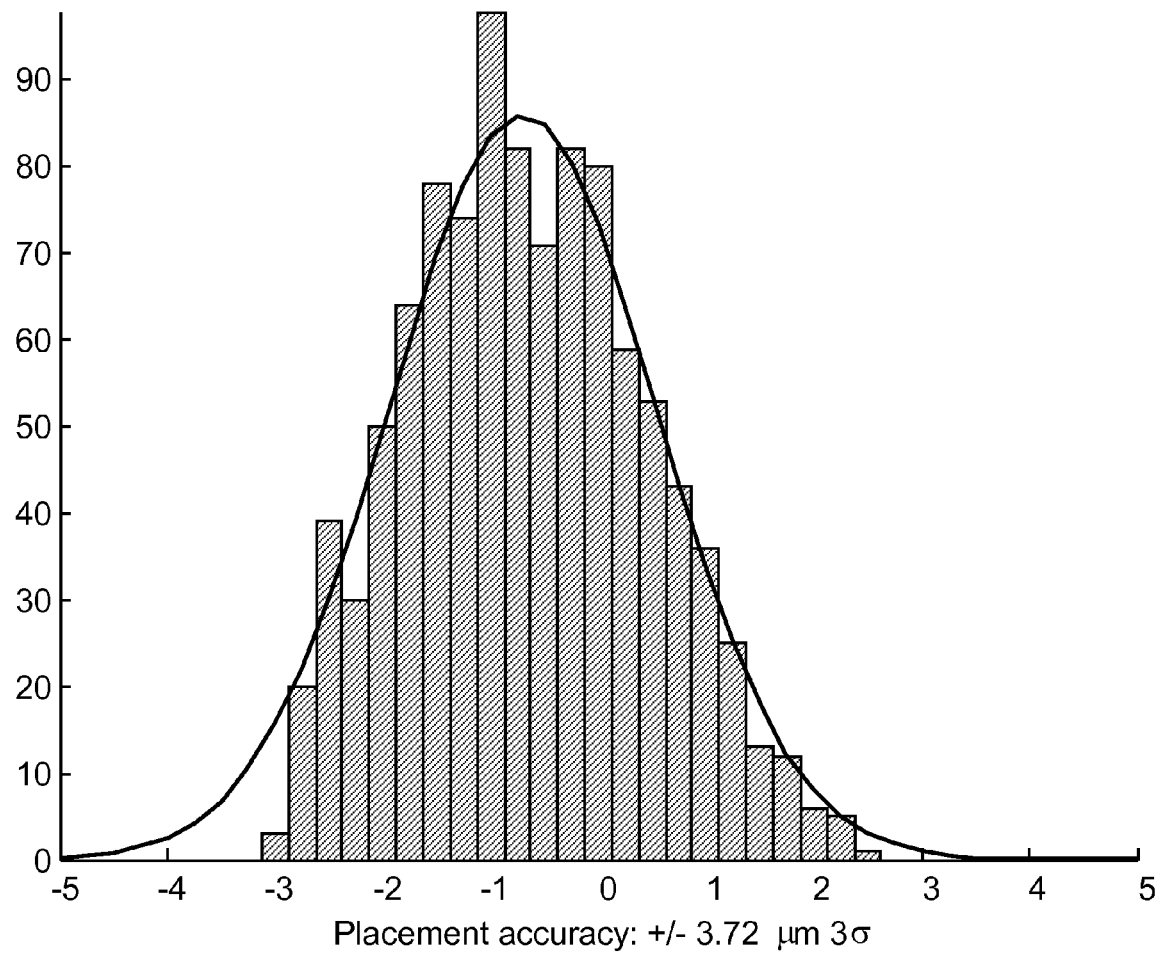

FIG. 6 provides placement accuracy measurements of silicon chiplets transferred onto a target substrate using a reinforced composite stamp of the present invention. These measurements were obtained by analyzing a collection of images acquired using a high resolution CCD camera) and analyzed using a similar image analysis algorithm. Local metal alignment marks were defined using standard semiconductor process onto the surface of a target glass wafer. The misalignment results are reported on a color coded type (FIG. 6A) and histogram (FIG. 6B) plots. These results indicate that the presented reinforced composite stamps are capable of transferring a large array (1024 in this case) of semiconductor chiplets with a placement accuracy that is better than about 4 μm at 3 sigma. The placement accuracy in the present example may be limited by the alignment accuracy of the printer used to record this set of data (limited by the resolution of the dry transfer printer linear and rotary stages).

REFERENCES

U.S. Pat. No. 6,062,133 May 16, 2000 Blalock
U.S. Pat. No. 6,829,988 Dec. 14, 2004 George et al.
U.S. Pat. No. 5,947,027 Dec. 7, 1999 Burgin et al.
U.S. Pat. No. 6,876,081 Apr. 5, 2005 Chow
U.S. Pat. No. 6,855,378 Feb. 15, 2005 Narang
U.S. Pat. No. 6,740,543 May 24, 2005 Rutiser
U.S. Pat. No. 4,503,335 Mar. 5, 1985 Takahashi
U.S. Pat. No. 6,918,982 Jul. 19, 2005 Afzali-Ardakani et al.
U.S. Pat. No. 7,296,519 Nov. 20, 2007 Dona et al.
U.S. Pat. No. 7,295,256 Nov. 13, 2007 Kim
U.S. Pat. No. 6,976,424 Dec. 20, 2005 Bruno et al.
U.S. Pat. No. 6,881,366 Apr. 19, 2005 Hougham et al.
U.S. Pat. No. 6,792,856 Sep. 21, 2004 Hall et al.
U.S. Pat. No. 6,521,489 Feb. 18, 2003 Duthaler et al.
U.S. Pat. No. 5,937,758 Aug. 17, 1999 Maracas et al.
U.S. Pat. No. 5,669,303 Sep. 23, 1997 Maracas et al.
U.S. Pat. No. 5,512,131 Apr. 30, 1996 Kumar et al.
U.S. Ser. No. 11/423,192, Khang et al., "Pattern Transfer Printing By Kinetic Control Of Adhesion To An Elastomeric Stamp."
U.S. Ser. No. 11/421,654, Khang et al., "Printable Semiconductor Structures An Related Methods Of Making And Assembling."
U.S. Ser. No. 11/145,574, Khang et al., "Methods And Devices For Fabricating And Assembling Printable Semiconductor Elements."
U.S. Ser. No. 11/001,689, Jeon et al., "Methods and Device For Fabricating Three-Dimensional Nanoscale Structures."

U.S. Pat. No. 7,195,733, Rogers et al., "Composite patterning devices for soft lithography."

Statements Regarding Incorporation by Reference and Variations

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure.

Every formulation or combination of components described or exemplified herein can be used to practice the invention, unless otherwise stated.

Whenever a range is given in the specification, for example, a temperature range, a size or distance range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

I claim:

1. A composite stamp extending laterally along lateral dimensions and vertically along a vertical dimension, said composite stamp comprising:
    a deformable layer having an internal surface and an external surface positioned opposite said internal surface, said external surface of said deformable layer having a plurality of relief features;
    a rigid support layer connected to said internal surface of said deformable layer, wherein said rigid support layer has a bottom surface and a top surface positioned opposite said bottom surface, wherein said bottom surface is positioned proximate to said internal surface of said deformable layer; and
    a reinforcement layer operably connected to said rigid support layer, said reinforcement layer having an opening that vertically coincides with at least a portion of said relief features of said external surface of said deformable layer.

2. The composite stamp of claim 1 wherein said deformable layer, rigid layer and reinforcement layer are configured to provide said stamp having an anisotropic distribution of Young's modulus or flexural rigidity providing flexibility along a vertical dimension and in-plane rigidity along a lateral dimension of said composite stamp.

3. The stamp of claim 1, wherein said rigid support layer comprises glass.

4. The stamp of claim 1, wherein said reinforcement layer is connected to said top surface of said rigid support layer.

5. The stamp of claim 1, wherein said reinforcement layer is connected to said bottom surface of said rigid support layer.

6. The stamp of claim 1, wherein said reinforcement layer is connected to said top surface and said bottom surface of said rigid support layer.

7. The stamp of claim 1, wherein said reinforcement layer is at least partially disposed between at least a portion of said deformable layer and said rigid support layer or wherein said reinforcement is at least partially embedded in said deformable layer.

8. The stamp of claim 1 wherein said rigid support layer has a thickness extending along said vertical dimension that is less than or equal to 500 µm.

9. The stamp of claim 1, wherein said rigid support layer has a thickness extending along said vertical dimension selected over the range of 100 µm to 300 µm.

10. The stamp of claim 1, wherein said rigid support layer has a flexural rigidity selected over the range of $10^{-3}$ Nm to 1 Nm.

11. The stamp of claim 1, wherein said rigid support layer comprises a glass selected from the group consisting of: soda-lime type glass, low coefficient of thermal expansion borosilicate type glass and alkali-free aluminoborosilicate E-type glass.

12. The stamp of claim 1, wherein said reinforcement layer comprises a fiber component selected from the group consisting of carbon fibers, polymer fibers, liquid crystal fibers, and glass fibers.

13. The stamp of claim 1, wherein said reinforcement layer comprises woven fiberglass.

14. The stamp of claim 1, wherein said rigid support layer has a flexural rigidity, and wherein said reinforcement layer has a flexural rigidity that is at least ten times less than said flexural rigidity of said rigid support layer.

15. The stamp of claim 1, wherein said reinforcement layer has a flexural rigidity selected over the range of $10^{-4}$ Nm to $10^{-2}$ Nm.

16. The stamp of claim 1, wherein said reinforcement layer has an average thickness selected over the range of 100 microns and 1000 microns.

17. The stamp of claim 1, wherein said reinforcement layer is only partially disposed between said deformable layer and said rigid support layer.

18. The stamp of claim 1, wherein said reinforcement layer overlaps between 5% and 25% of the area of said top surface or said bottom surface of said rigid support layer.

19. The stamp of claim 1, wherein said reinforcement layer has an area of overlap with said top surface or said bottom surface of said rigid support layer selected over the range of 4 cm² to 180 cm².

20. The stamp of claim 1 wherein said opening of said reinforcement layer has a surface area selected over the range of 40 cm² to 700 cm².

21. The stamp of claim 1 wherein said opening of said reinforcement layer has a surface area selected over the range of 5% and 25% of the area of said rigid support layer.

22. The stamp of claim 1, wherein said reinforcement layer is a ring.

23. The stamp of claim 22, wherein said ring comprises woven fiberglass.

24. The stamp of claim 1, wherein said reinforcement layer is chemically bonded to said rigid support layer, said deformable layer, or both.

25. The stamp of claim 1, wherein said deformable layer further comprises
    an annular mounting flange; and
    a flange connector,
    wherein said flange connector operably connects said annular mounting flange to said external surface of said deformable layer, so that said external surface and said mounting flange surface are in different planes separated by a clearance distance, wherein said clearance distance is at least 500 µm.

26. The stamp of claim 25, wherein said clearance distance is selected over the range of 0.5 millimeters and 2 millimeters.

27. The stamp of claim 25, wherein the reinforcement layer is at least partially embedded in said flange connector.

28. The stamp of claim 25, wherein said annular mounting flange and said flange connector are formed from said deformable layer.

29. The stamp of claim 1, wherein said deformable layer comprises an elastomer.

30. The stamp of claim 1, wherein said relief features are selected from the group consisting of: a stabilization feature; a transfer post; and an alignment feature.

31. The stamp of claim 1, wherein said external surface of said deformable layer experiences a vertical bow of less than 100 µm for an actuation force less than or equal to 50 mPSI.

32. The stamp of claim 1, wherein said stamp has a placement accuracy of printable elements that is better than 4 µm at 3σ over a patterned substrate surface area greater than or equal to 9 cm².

33. The stamp of claim 1, wherein said internal surface of said deformable layer is bonded to an inner region of said support layer, wherein said inner region is constrained by said reinforcement layer bonded to an outer edge region.

34. The stamp of claim 1, further comprising a protruding reinforcement ring that anchors said support layer to said deformable layer, said reinforcement layer, or both.

35. A method for making a reinforced composite stamp, said method comprising the steps of:
    providing a master relief pattern having a selected three-dimensional relief pattern;
    providing a rigid support layer having a bottom surface and a top surface opposite said bottom surface, wherein the bottom surface of the rigid support layer faces the master relief pattern, thereby defining a bottom surface and a top surface of a stamp-forming chamber;
    providing a reinforcement layer in contact with the top surface or bottom surface of the rigid support layer, the reinforcement layer having an opening that vertically coincides with at least a portion of the master relief pattern;
    introducing to said stamp-forming chamber a prepolymer;
    polymerizing said prepolymer, thereby generating a polymer layer in contact with said reinforcement layer and said bottom surface of the rigid support layer; and
    separating said polymer layer from said master relief pattern, thereby making said reinforced composite stamp comprising said polymer layer, said reinforcement layer, and said rigid support layer.

36. The method of claim 35, wherein said rigid support layer comprises a glass backing.

37. The method of claim 35, wherein said glass backing has a thickness selected over the range of 100 microns to 300 microns.

38. The method of claim 35, further comprising the steps of:
    adjusting the relative position of said rigid support layer and said master relief pattern to obtain a vertical separation distance between said rigid support layer and said master relief pattern, wherein said separation distance is less than or equal to 1 mm.

39. The method of claim 35, further comprising the steps of:
- providing a wafer holder assembly, wherein said wafer holder assembly securably holds said master relief pattern;
- providing a stamp molding assembly, where said stamp molding assembly securably holds said rigid support layer;
- coupling said wafer holder assembly to said stamp molding assembly, wherein said coupling provides a separation distance between said master relief pattern and said rigid support layer, wherein said separation distance is greater than or equal to 1 mm;
- introducing said prepolymer to said stamp-forming chamber via an inlet port positioned through one or both of said wafer holder assembly and stamp molding assembly, wherein said prepolymer is a degassed elastomer mixture;
- exhausting excess degassed elastomer mixture out of said stamp-forming chamber by decreasing said separation distance to a decreased separation distance; and
- decoupling said wafer holder assembly from said stamp molding assembly after said polymerization step.

40. The method of claim 39, wherein said step of decreasing said separation distance decreases the separation distance to less than 500 micrometers.

41. The method of claim 35, wherein said reinforcement layer is a shaped reinforcement layer having one or more openings.

42. The method of claim 35, wherein said reinforcement layer is a ring.

43. The method of claim 42, wherein said rigid support layer terminates laterally at one or more outer edges, where said ring is disposed at least partially between said outer edges and said deformable layer.

44. The method of claim 42, wherein said ring comprises woven fiberglass.

45. The method of claim 35 further comprising the step of at least partially embedding said reinforcement layer in said deformable layer.

46. A device for making a composite stamp, said device comprising:
- a wafer holder assembly;
- a fastener operably connected to said wafer holder assembly for securing a master to said wafer holder assembly;
- a stamp mold assembly releaseably connected to said wafer holder assembly;
- an elastomeric holder that is connected to said stamp mold assembly for supporting a rigid backing, wherein said rigid backing has a surface that faces a surface of said master;
- vertical adjusters connected to said wafer holder assembly, said stamp mold assembly, or both, to provide a user-selectable separation distance between said master and said thin glass backing, wherein said separation distance is variable and selectable over a range that is greater than or equal to 100 μm and less than or equal to 2 mm; and
- one or more openings for introducing or exhausting a prepolymer to or from a stamp-forming chamber that is between said master and said rigid backing faces.

47. The device of claim 46, wherein said elastomeric holder comprises a chuck having an exhaust port, said system further comprising:
- a vacuum source operably connected to said exhaust port for lamination of said rigid backing; and
- a shaped reinforcement layer supported by said rigid backing surface that faces said master;

wherein said rigid backing comprises a glass backing having a thickness that is less than or equal to 500 μm.

48. The device of claim 46, wherein said vertical adjusters comprise a plurality of bolts that are mechanically coupled to each of said wafer holder assembly and stamp mold assembly.

49. A printing tool device for dry transfer printing of semiconductors into or onto a target substrate, said device comprising:
- a reinforced composite stamp comprising:
  - a deformable layer having an internal surface and an external surface positioned opposite said internal surface, said external surface of said deformable layer having a plurality of relief features;
  - a rigid support layer connected to said internal surface of said deformable layer, wherein said rigid support layer has a bottom surface and a top surface positioned opposite said bottom surface, wherein said bottom surface is positioned proximate to said internal surface of said deformable layer; and
  - a reinforcement layer operably connected to said rigid support layer, said reinforcement layer having an opening that vertically coincides with at least a portion of said relief features of said external surface of said deformable layer;
- a mounting flange having a top surface;
- a vertical section that operably connects said mounting flange to said deformable layer external surface; and
- a transfer printing tool head comprising a receiving surface that is connected to said mounting flange top surface.

50. The device of claim 49 wherein said reinforcement layer is connected to said bottom surface of said rigid support layer, to said top surface of said rigid support layer, or to both said bottom surface and said top surface of said rigid support layer.

51. The device of claim 49, wherein said connection between said stamp and said tool head comprises:
- a holding platform; and
- a fastener;
- wherein said fastener extends from said holding platform, through said stamp mounting flange to said receiving surface, thereby connecting said stamp to said tool head.

52. The device of claim 49, further comprising a vacuum chuck for holding said stamp to said tool head.

53. The device of claim 49, further comprising vacuum grooves positioned in said tool head receiving surface.

54. The device of claim 49, further comprising:
- a holding platform that opposes said printing tool head receiving surface, wherein said holding platform has a cavity that is at least partially filled by said stamp mounting flange;
- a fastener that extends through said receiving surface, said stamp mounting flange and at least partially through said holding platform; and
- wherein a portion of said holding platform contacts said vacuum grooves.

55. The device of claim 49, further comprising a target substrate operably connected to said stamp, wherein said target substrate has a surface area that is greater than the printable surface area of said stamp.

56. A method for patterning a substrate surface with semiconductor elements, said method comprising the steps of:
- providing a composite stamp comprising:
  - a deformable layer having an internal surface and an external surface positioned opposite said internal surface, said external surface of said deformable layer having a plurality of relief features;

a rigid support layer connected to said internal surface of said deformable layer, wherein said rigid support layer has a bottom surface and a top surface positioned opposite said bottom surface, wherein said bottom surface is positioned proximate to said internal surface of said deformable layer; and a reinforcement layer operably connected to said deformable layer and said rigid support layer, said reinforcement layer having an opening that vertically coincides with at least a portion of said relief features of said external surface of said deformable layer;

contacting said external surface of said deformable layer of said reinforced composite stamp with said semiconductor elements; thereby transferring at least a portion of said semiconductor elements to said external surface of said deformable layer;

contacting said reinforced composite stamp having said semiconductor elements and said substrate surface in a manner exposing at least a portion of said semiconductor elements on said external surface to said substrate surface; and separating said reinforced composite stamp and said substrate surface, thereby transferring at least a portion of said semiconductor elements to said substrate surface and generating said pattern on said substrate surface.

57. The method of claim 56 wherein said rigid support layer has a flexural rigidity, and wherein said reinforcement layer has a flexural rigidity that is at least ten times less than said flexural rigidity of said rigid support layer.

58. The method of claim 56, wherein said step of contacting said reinforced composite stamp having said semiconductor elements and said substrate surface comprises establishing conformal contact between at least a portion of said external surface of said deformable layer having said semiconductor elements and said substrate surface.

59. The method of claim 56, wherein said step of contacting said external surface of said deformable layer of said reinforced composite stamp with said semiconductor elements comprises contacting said relief features of said external surface with said semiconductor elements.

60. The method of claim 56, wherein said step of separating said reinforced composite stamp and said substrate surface comprises moving the reinforced composite stamp in a direction away from said substrate surface.

61. The method of claim 56, wherein said substrate surface has a surface area patterned with said semiconductor elements that is larger than the surface area of the external surface of said deformable layer of said reinforced composite stamp.

62. The method of claim 56, further comprising repeating said steps of:

contacting said external surface of said deformable layer of said reinforced composite stamp with said semiconductor elements; contacting said reinforced composite stamp having said semiconductor elements and said substrate surface; and separating said reinforced composite stamp and said substrate surface;

wherein repeating said steps provides semiconductor elements to different regions of said substrate surface.

63. A composite stamp comprising:

an elastomer layer having an internal surface and an external surface positioned opposite said internal surface, said external surface of said elastomer layer having a plurality of relief features;

a glass backing having a thickness less than or equal to 500 microns; said glass backing connected to said internal surface of said elastomer layer; wherein said glass backing has a bottom surface and a top surface positioned opposite said bottom surface, wherein said bottom surface is positioned proximate to said internal surface of said elastomer layer; and a reinforcement layer having a fiber component; wherein said reinforcement layer is connected to said bottom surface of said glass backing or said top surface of said glass backing, said reinforcement layer having an opening that vertically coincides with at least a portion of said relief features of said external surface of said elastomer layer.

64. The stamp of claim 63 wherein said reinforcement layer comprises woven fiber glass.

65. The stamp of claim 63 wherein said reinforcement layer is a ring; wherein said glass backing terminates laterally at one or more outer edges, where said ring is disposed at least partially between said outer edges and said elastomer layer.

66. The stamp of claim 63 wherein said reinforcement layer has an average thickness selected over the range of 100 microns to 500 microns.

67. The stamp of claim 63, wherein said glass backing layer has a flexural rigidity, and wherein said reinforcement layer has a flexural rigidity that is at least ten times less than said flexural rigidity of said glass backing.

68. The stamp of claim 63, wherein said reinforcement layer has a flexural rigidity selected over the range of $10^{-4}$ Nm to $10^{-2}$ Nm.

69. The stamp of claim 63, wherein said reinforcement layer has an average thickness selected over the range of 100 microns and 1000 microns.

* * * * *